United States Patent
Oshima

(10) Patent No.: US 6,946,031 B2
(45) Date of Patent: Sep. 20, 2005

(54) ROD FOR A COATING DEVICE, AND PROCESS FOR PRODUCING THE SAME

(75) Inventor: Atsushi Oshima, Shizuoka-ken (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/357,498

(22) Filed: Feb. 4, 2003

(65) Prior Publication Data
US 2003/0175519 A1 Sep. 18, 2003

(30) Foreign Application Priority Data

Feb. 8, 2002 (JP) ........................................ 2002-031697
Feb. 21, 2002 (JP) ........................................ 2002-044265
Feb. 21, 2002 (JP) ........................................ 2002-044266
Feb. 21, 2002 (JP) ........................................ 2002-44267

(51) Int. Cl.$^7$ ............................................. B05C 11/02
(52) U.S. Cl. ...................... 118/117; 118/118; 118/119; 118/126; 118/203; 118/261
(58) Field of Search ................................. 118/117, 118, 118/119, 123, 126, 203, 261; 101/120; 162/281; 15/256.5; 492/53, 54; 428/409

(56) References Cited

U.S. PATENT DOCUMENTS 5,595,601 A * 1/1997 Lintula ....................... 118/110
6,200,248 B1 * 3/2001 Vestola et al. ................. 492/54
6,413,314 B1 * 7/2002 Ruckert et al. ............. 118/119

FOREIGN PATENT DOCUMENTS

JP          61-129205       *   6/1986

* cited by examiner

Primary Examiner—Laura Edwards
(74) Attorney, Agent, or Firm—Sughrue Mion, PLLC

(57) ABSTRACT

A rod for a coating device, used when a continuously-running body is coated with a coating solution, includes: a columnar base material; and an abrasion-resistant coating formed on a circumferential surface of the base material. When a friction coefficient between the coating and the body is represented by $\mu$, a Vickers hardness of the coating is represented by Hv, a thermal expansion coefficient of the base material is represented by $\alpha_1 \times 10^{-6}/°$ C., a thermal expansion coefficient of the coating is represented by $\alpha_2 \times 10^{-6}/°$ C., and a film thickness of the coating is represented by t $\mu$m, $\mu$ and Hv satisfy a predetermined relational expression, and/or $\alpha_1$, $\alpha_2$ and t satisfy another predetermined relational expression. Specifically, $Hv > 1500 \times \mu^2 + 1200$ and/or $|\alpha_1 - \alpha_2| < 3/(t-4)+7$. The invention provides a process for producing a rod, for a coating device, on which an abrasion-resistant coating is formed on a base material to have a uniform thickness.

19 Claims, 23 Drawing Sheets

F I G . 4
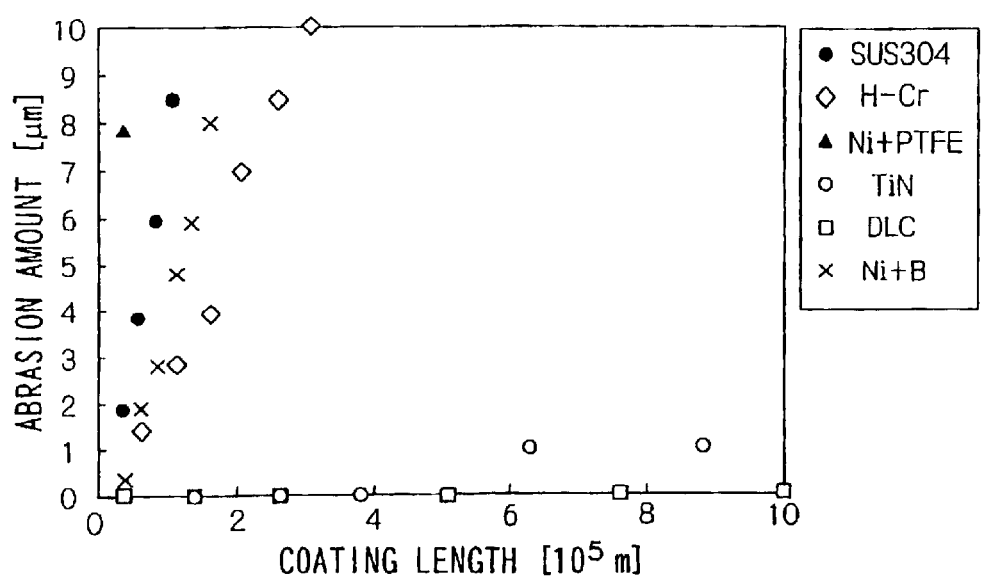

PRIOR ART

ROD FOR A COATING DEVICE, AND PROCESS FOR PRODUCING THE SAME

BACKGROUND OF THE INVENTION

1. Field of the Invention

The present invention relates to a rod for a coating device, on the surface of which a coating having abrasion resistance is formed, and a process for producing the same, and more specifically relates to a rod for a coating device which is suitable for coating a body to be coated, such as a continuously-running web, with a coating solution, and a process for producing the same.

2. Description of the Related Art

It is widely performed that, when a photosensitive material, a photoengraving process material, a magnetic recording material, recording paper material, a photosensitive planographic printing plate, or the like is produced, a sheet-form or web-form body to be coated (substrate to be coated) made of a thin metal, paper, film or the like is continuously run in a longitudinal direction and simultaneously one single side thereof is coated with a coating solution (photosensitive solution).

In many cases, at the time of the coating, a rod (bar) for a coating device is brought into contact with a surface of the body to be coated, and the rod is rotated while the coating solution is supplied onto the surface of the rod, whereby the coating is attained. This coating process is called bar coating process.

For example, as illustrated in FIG. 8, in a rod 40 for a coating device (referred to merely as the rod 40 hereinafter) in the prior art, grooves 48 are generally made in the surface along the circumferential direction, and a coating 44 having abrasion resistance is formed on a columnar base material 44 by surface reforming treatment. The formation of the coating 44 can be performed in various manners such as plating, physical vapor deposition and chemical vapor deposition.

A first problem to be solved for a rod for a coating device in the prior art is that in the case that the rod 40 is used to perform high-speed coating (in particular, in the case that high-speed coating is applied to an anodizated aluminum web), convex portions 46 made in the rod 40 are abraded in a short time. In the case that the convex portions 46 are abraded in a short time in this manner, the grooves 40 made in the rod 40 become shallow so that the adjustment precision of the amount of a coating solution with which a body to be coated, such as a web, is coated lowers. As a result, it is necessary that the rod 40 is frequently exchanged. This is a serious problem for attainment of an improvement in productivity and energy-saving in the step of coating the web with the coating solution. Even in a rod for a coating device in which no grooves are formed, its coating is partially abraded so that the same problem is caused.

Examples in which a countermeasure against the problem is taken are disclosed in Japanese Patent Application Laid-Open (JP-A) Nos. 2001-901, 2000-343012, 2000-354808, 2000-334349, and 04-048956.

Incidentally, in order to improve the abrasion resistance of the rod surface, it is effective to take measures considering both of the hardness of the coating 44 and the friction coefficient between the coating 44 and the web (body to be coated) W. However, the above-mentioned publications never describe consideration of the two.

In order to form the abrasion-resistant coating 44, it is preferred to use ion plating. However, no publications disclose which manner of ion plating should be used for the film formation. When the film is formed in a holocathode manner from among ion plating manners, a uniform and good coating is formed over a wide area. Such examples are disclosed in JP-A Nos. 55-100975, 1-240646, 5-25617, and 8-100254. However, the publications never consider that such examples are applied to a rod for a coating device.

A second problem to be solved for any coating device rod in the prior art is that in the case that a large shearing force or normal stress is applied to the surface of the rod when the rod is used, its coating is chipped or peeled from its base material. A main cause for this is that residual stress generated in the coating is large. This residual stress is generated by a thermal expansion difference between the base material and the coating.

The problem is generated not only in coating device rods in which grooves are made in the surface along the circumferential direction but also in coating device rods in which no grooves are made.

Examples in which a countermeasure against this problem is taken are disclosed in JP-A Nos. 2001-901, 2000-343012, 2000-354808, and 2000-334349.

Incidentally, in order to prevent the coating of a coating device rod from being chipped, it is effective to take measures considering both of the film thickness of the coating and a thermal expansion coefficient difference between the coating and the base material. However, these publications never describe consideration of the two.

A third problem to be solved for any coating device rod in the prior art is that at the time of forming a coating thereon, very small cracks (chippings) are generated in the coating. This is based on a large difference in thermal expansion between the base material and the coating. The generation of the chippings is a serious obstruction against an improvement in the productivity of the coating device rod.

The problem is generated not only in coating device rods in which grooves are made in the surface along the circumferential direction but also in coating device rods in which no grooves are made.

Examples in which an intermediate layer is formed, as a countermeasure against the problem, between the base material and the coating are disclosed in JP-A Nos. 6-64087 and 2000-354808.

However, thermal expansion is never taken into consideration in these publications. Thus, it is desired to take further measures.

A fourth problem to be solved for any coating device rod in the prior art is about the process for producing the same. As described above, an abrasion-resistant coating is generally formed on the surface of the coating device rod. The formation of the coating can be performed in various manners such as plating, physical vapor deposition, and chemical vapor deposition. In many cases, however, a vacuum chamber is used to form the coating by physical vapor deposition such as ion plating. From the viewpoint of abrasion resistance, it is preferred to form the coating uniformly. Accordingly, when the coating is formed by ion plating, various means are adopted to form this coating uniformly.

For example, in JP-A No. 63-192855, ionization efficiency is improved to form a uniform coating in a large area. In JP-A Nos. 01-240646 and 01-252764, in order to form a uniform coating in a large area, ionization efficiency is improved and the speed of forming the coating is made high.

However, when a columnar base material, which is a body to be coated, becomes significantly long, an ordinary chamber cannot receive the base material. Even if a large-sized chamber can receive the long base material, a vapor deposition source is then often set up at a position apart from the center of such a large-sized chamber. In other words, due to the restriction by the size of the chamber, the base material cannot be arranged right above the vapor deposition source in many cases. Therefore, there arises a problem that a coating having a large thickness is formed in base material regions near the vapor deposition source, and a coating having a small thickness is formed in base material regions far from the vapor deposition source. Even if the center of the base material can be arranged just above the vapor deposition source, there arises a problem that when the base material is relatively long, the thickness of the formed coating is smaller at both ends of the base material than at the center thereof.

JP-A No. 02-077573 or 02-079764 describes an example in which a long object, which is a body to be coated, is continuously run and simultaneously a coating is uniformly formed by ion plating. However, such an example cannot be applied to the case that a coating is formed on a non-continuous object, such as a base material of a coating device rod.

SUMMARY OF THE INVENTION

In light of the above-mentioned situation, a first object of the present invention is to provide a rod for a coating device in which a coating superior in abrasion resistance is formed on the surface thereof (in order to solve the first and second problems).

A second object of the invention is to provide a rod for a coating device capable of preventing cracks or peeling from being generated in the surface thereof (in order to solve the third problem). A third object of the invention is to provide a process for producing a rod for a coating device wherein an abrasion-resistant coating is formed on a base material so as to have a uniform thickness (in order to solve the fourth problem).

To attain the first object, a first aspect of the invention provides a rod for a coating device, used when a continuously-running body to be coated is coated with a coating solution, the rod comprises: a columnar base material; and an abrasion-resistant coating formed on a circumferential surface of the base material, the coating including in at least one layer, wherein the material of the coating is selected so that the friction coefficient p between the coating and the body to be coated and the Vickers hardness Hv of the coating satisfy the following relationship expression: $Hv>1500\times\mu^2+1200$.

The friction coefficient in the specification and the claims means a dynamic friction coefficient. The continuously-running body to be coated is mainly in a web or sheet form. The coating solution is any one of various liquid materials, such as a photosensitive solution.

According to the first aspect, the coating can be made not to be easily abraded even if the running distance of the body to be coated is relatively long. Therefore, even if the coating device rod is used to apply the coating solution to the body to be coated at a high speed, it is avoided that the coating is consumed in a short time so that coating precision lowers or coating defects such as coating streaks are generated.

In the present aspect, the Hv may be set to 1500 or more.

In this manner, the abrasion amount of the coating per the running distance of the body to be coated, can be sufficiently decreased.

In the present aspect, the dynamic friction coefficient may be set to 0.5 or less.

In this manner, the abrasion amount of the coating per the running distance of the body to be coated can be sufficiently decreased.

In the present aspect, the coating may be formed by ion plating.

The coating formed by ion plating has better adhesiveness than coatings formed in other manners, and thus is not cracked or peeled.

In the present aspect, the coating may be formed by ion plating in a holocathode manner.

The coating formed in the holocathode manner has a smoother surface state than coatings formed in other manners of ion plating. Therefore, the contact area between the coating and the running body to be coated increases and the maximum shearing force generated in the coating in a coating step decreases, whereby the abrasion speed of the coating becomes small. Thus, the abrasion resistance of the coating can be further improved. The lower limit of the maximum roughness of the coat surface is not particularly limited. As this maximum roughness of the coat surface is smaller, the coat surface is more preferred.

In the present aspect, the coating film may be formed at a temperature of 400° C. or less.

In this manner, thermal stress (residual stress) generated when the rod temperature, returns to ambient temperature after the formation of the coating is easily made sufficient small.

In the present aspect, the film thickness of the coating may be set within the range of 0.2 to 4.0 μm.

If the film thickness is less than 0.2 μm, the coating does not have a sufficient thickness for preventing abrasion and further the surface of the coating is rough due to the roughness of the rod surface, so that the smoothness of the coating cannot be easily kept. If the film thickness is 4.0 μm or more, the coating is easily chipped. Thus, in the case that the temperature of the rod changes at the time of forming the coating or in the case that shearing force or normal stress is applied to the rod surface during the use of the coating device rod, the coating is easily cracked or peeled.

Preferably, the film thickness is 1.0 μm or more. In this case, the rod can have a sufficient lifespan.

In the present aspect, irregularities based on a groove may be made in the rod surface in order to adjust the amount of the coating solution applied onto the body to be coated.

In the case of the coating device rod (the so-called wireless bar) in which the surface thereof is made irregular by forming a groove in the rod surface in this way, coating solution amount adjusting means is integrated with the coating device rod. Accordingly, even if coating treatment is conducted in vacuum, the treatment can be made satisfactory by using such a wireless bar. This is characteristically different from the case of using a wire bar.

In order to attain the first object, in a second aspect of the invention, a rod for a coating device comprises a columnar base material and an abrasion-resistant coating formed on the surface of the base material, wherein when a thermal expansion coefficient of the base material is represented by $\alpha_1\times 10^{-6}/°$ C., a thermal expansion coefficient of the coating is represented by $\alpha_2\times 10^{-6}/°$ C., and a film thickness of the coating is represented by t μm, a relationship expression of $|\alpha_1-\alpha_2|<3/(t-4)+7$ is satisfied.

Considering both of the film thickness of the coating and the thermal expansion coefficient thereof in this way, thermal stress generated in the coating is limited to a given value or less, whereby even if the rod temperature changes so that thermal stress is generated in the coating due to a thermal expansion coefficient difference between the base material and the coating, the thermal stress, which is generated in the coating when it is formed, or residual stress generated in the coating after the formation of the film can be suppressed into the given value or less. Thus, even if the rod temperature changes while the coating is formed or shearing force or normal stress is applied to the rod surface while the rod is used, the coating is not easily cracked or peeled.

In the second aspect, the coating may be formed at a temperature of 350° C. or less.

In this manner, thermal stress (residual stress) generated in the coating is easily made sufficiently small when the rod temperature returns to ambient temperature after the formation of the coating.

In the present aspect, $|\alpha_1-\alpha_2|$ may be set to $1\times10^{-5}/°$ C. or less.

In this manner, the coating can be surely prevented from being chipped or peeled while the coating device rod is used.

In the present aspect, the film thickness of the coating may be set within the range of 0.2 to 4.0 $\mu$m.

If the film thickness is less than 0.2 $\mu$m, the coating does not have a sufficient thickness for preventing abrasion and further the surface of the coating is rough due to the roughness of the rod surface, so that the smoothness of the coating cannot be easily kept. If the film thickness is 4.0 $\mu$m or more, the coating is easily chipped.

Preferably, the film thickness is 1.0 $\mu$m or more. In this case, the rod can have a sufficient lifespan and the coating can be surely prevented from being chipped or peeled while the rod is used.

In order to attain the above-mentioned second object, in a third aspect of the invention, a rod for a coating device comprises a columnar base material, an intermediate layer formed on the surface of the base material, and an abrasion-resistant coating formed on the surface of the intermediate layer.

In this manner, it can be avoided that the coating is chipped.

In the third aspect, the thermal expansion coefficient of the intermediate layer may be smaller than that of the base material and larger than that of the coating, or may be larger than that of the base material and smaller than that of the coating.

As a result, even if the rod temperature changes so that thermal stress is generated due to a thermal expansion coefficient difference between the base material and the coating, the intermediate layer functions as a material for relieving this thermal stress. Consequently, the thermal stress generated in the coating can be decreased. Thus, in the case that the temperature of the rod changes at the time of forming the coating or in the case that shearing force or normal stress is applied to the rod surface during the use of the coating device rod, the coating is not easily cracked or peeled.

When the materials of the coating and the intermediate layer are selected, if the thermal expansion coefficients thereof are set in such a manner that these coefficients are not significantly different from that of the base material, thermal stress, which remains in the coating at ambient temperature, can be decreased. Such selection is preferred for preventing the coating from being cracked or peeled.

In the present aspect, the intermediate layer may be composed of plural layers. The thermal expansion coefficients of the respective layers may be set to become higher or lower, one layer by one layer, from the base material side to the coating side.

As a result, it can be avoided that large thermal stress is generated in the coating even if the thermal expansion coefficient difference between the base material and the coating is relatively large.

In the present aspect, the film thickness of the intermediate layer may be set within the range of 3 to 12 $\mu$m. If the film thickness is less than 3 $\mu$m, the intermediate layer does not have a sufficient thickness for preventing abrasion and further the surface of the coating is rough due to the roughness of the rod surface, so that the smoothness of the coating cannot be easily kept. If the film thickness is more than 12 $\mu$m, uniformity in adhesion of the coating onto the intermediate layer is lost. As a result, the surface of the coating is not made to be a uniform surface.

In the present aspect, the film thickness of the coating may be set within the range of 0.2 to 4.0 $\mu$m.

If the film thickness is less than 0.2 $\mu$m, the surface of the coating is rough due to the roughness of the intermediate layer, so that the smoothness of the coating cannot be easily kept. If the film thickness is 4.0 $\mu$m or more, the coating is easily chipped.

In the present aspect, the coating may be formed by ion plating.

In this manner, the temperature of the coating can be made sufficiently low when the coating is formed. Additionally, the adhesive force of the coating to the base material can be made significantly large.

In the present aspect, the coating may be formed at a temperature of 350° C. or less.

In this manner, thermal stress (residual stress) generated in the coating when the rod temperature returns to ambient temperature after the formation of the coating is easily made sufficiently small.

In the present aspect, irregularities based on a groove may be made in the rod surface in order to adjust the amount of the coating solution applied onto the body to be coated.

In the case of the coating device rod (the so-called wireless bar) in which the surface thereof is made irregular by forming a groove in the rod surface in this way, coating solution amount adjusting means is integrated with the coating device rod. Therefore, even if coating treatment is conducted in vacuum, the treatment can be carried out satisfactory by using such a wireless bar. This is characteristically different from the case of using a wire bar.

In order to attain the above-mentioned third object, in a fourth aspect of the invention, a process for producing a rod for a coating device, an abrasion-resistant coating being formed on the circumferential surface of a columnar base material, comprises: an arrangement step of arranging the base material inside a chamber of a vapor deposition device; a first coating forming step of vapor-depositing a coating material from a vapor deposition source over an area from one end portion of the base material to a central portion thereof; a rearrangement step of rearranging the base material so that positions of the one end portion of the base material and the other end portion are exchanged with each other; and a second coating forming step of vapor-depositing the coating material from the vapor deposition source over an area from the other end portion of the base material to the central portion thereof.

As the vapor deposition device, there is usually used a physical vapor deposition device about which a range in chamber in which coating formation is possible is already known.

According to the fourth aspect, in the second coating forming step, a coating can be formed on a portion of a base material which portion is beyond the range in which coating formation is possible in the first coating forming step. Moreover, as the coating is formed by the two separate steps, the film thickness of the coating can be made larger than that of any coating according to the prior art. Furthermore, if the length of the base material is not more than two times the length of the range in which coating formation is possible, the coating can be formed over the whole of the base material.

In the rearrangement step, for example, the base material is taken out from the chamber, and then the base material is rearranged by inserting the base material in the direction opposite to the direction along which the base material was inserted into the chamber in the arrangement step. In this manner, the rearrangement step can easily be performed without setting up any special mechanism.

In the present aspect, in the first coating forming step, the coating may be made so as to form a first coating gradually-thinned portion, in which the thickness thereof is made gradually thin from the one end of the base material to the central portion thereof. In the second coating forming step, the coating may be made on the first coating gradually-thinned portion so as to form a second coating gradually-thinned portion, in which the thickness thereof is made gradually thin from the other end of the base material to the central portion thereof.

In this manner, the coating can be made to have a uniform thickness as a whole even if the base material is long.

In the present aspect, in the arrangement step, the position of the base material may be set using the boundary of the range in which coating formation is possible as a criterion or reference.

In this manner, the position of the base material is easily set, and the position of the base material on which the coating is formed to have a uniform thickness is easily found out.

Since appropriate arrangement positions of the base material are different for respective vapor deposition devices, it is preferred, for making a coating film having an uniform thickness, to determine the position of the base material on which the coating is formed to have a uniform thickness for the respective vapor deposition devices.

In the present aspect, an ion plating device may be used as the vapor deposition device.

In this manner, the coating film is easily formed to have a large adhesive force and a uniform thickness.

BRIEF DESCRIPTION OF THE DRAWINGS

FIG. 4 is a graph showing experimental results in Example 1.

DETAILED DESCRIPTION OF THE PREFERRED EMBODIMENTS

A rod for a coating device based on the first aspect of the present invention (the rod being used to coat a running web with a coating solution) will be described according to first and second embodiments. For simplicity, a rod for a coating device is referred to merely as "a rod" in the description on the embodiments of the invention.

[First Embodiment]

Figure 1:
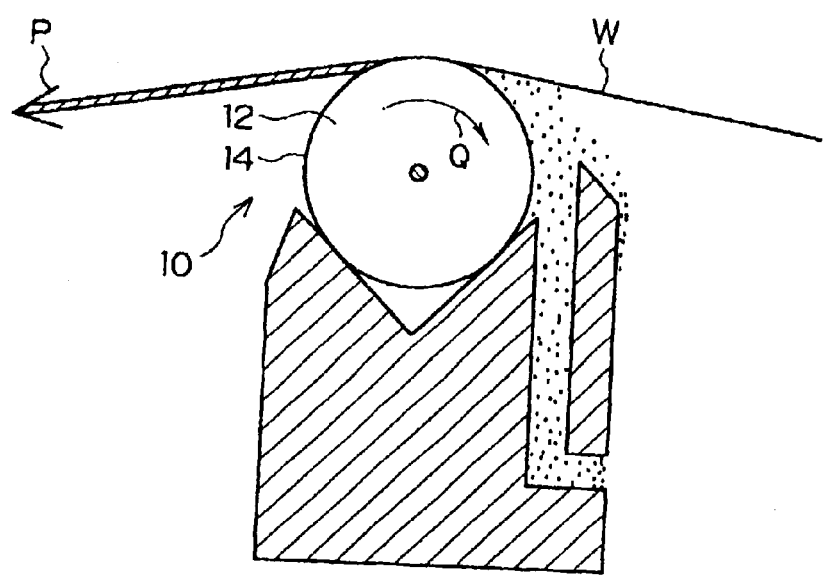
FIG. 1 is a sectional side view illustrating a state that a rod for a coating device according to a first embodiment of the present invention is used to coat a web with a coating solution.

As illustrated in FIG. 1, a rod 10 according to the first embodiment is a rod for both of coating a running web W with a coating solution and adjusting the amount of the coating solution.

Figure 2:
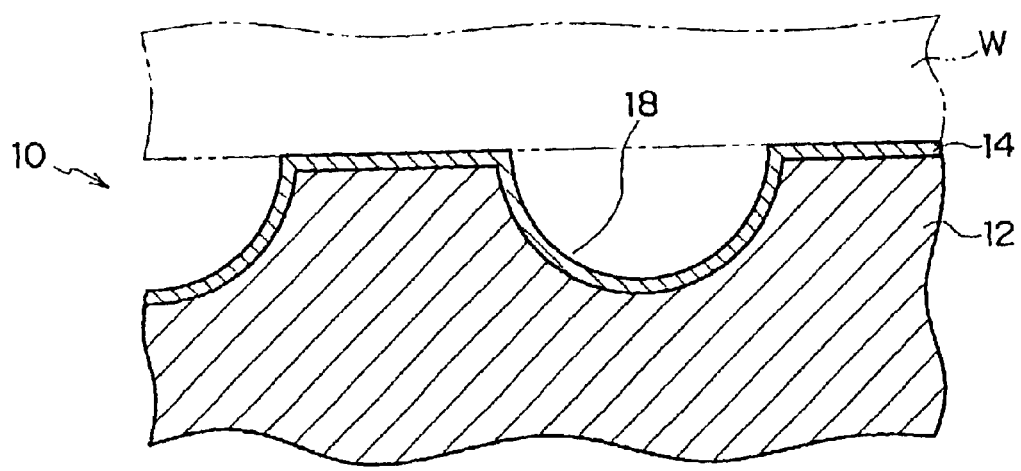
FIG. 2 is a partially-enlarged sectional side view of the coating device rod according to the first embodiment.

The rod 10 is a rod in which an abrasion-resistant coating 14 is formed on the circumferential surface of a columnar base material 12. In many cases, the base material 12 is made of stainless steel. In the circumferential surface of the base material 12, many grooves 18 are made along the circumferential direction (that is, a direction which is perpendicular to the axial direction and is along the running direction of the web W) (see FIG. 2) As a result, the circumferential surface of the rod is made irregular.

When the friction coefficient between the coating 14 and the web W is represented by $\mu$, the material of the coating 14 is selected in such a manner that the value of the Vickers hardness Hv of the coating 14 satisfies the following formula (1):

$$Hv > 1500 \times \mu^2 + 1200 \qquad (1)$$

In this conditional expression, the higher the friction coefficient, the higher Vickers hardness Hv is in accordance therewith.

As a result, the coating 14 of the rod 10 is not easily abraded. Therefore, even if the rod 10 is used to coat the web W with the coating solution at a high speed, it is avoided that coating precision deteriorates and/or coating defects such as coating streaks are generated. Since the lifespan of the rod 10 becomes long, the number of the rods 10 to be consumed per production decreases. This fact significantly contributes to a drop in production costs. Moreover, the number at which the rods 10 is exchanged during the use thereof (i.e., during the operation of the coating line to which the rod 10 is provided) is decreased. As a result, the operating rate of the line for producing the web W is significantly improved.

The film thickness of the coating 14 is preferably set within the range of 1.0 to 4.0 $\mu$m. By setting the film thickness to 1.0 $\mu$m or more, the coating has a sufficient thickness for preventing abrasion. Additionally, it is prevented that the coating surface is made rough due to the roughness of the rod surface. As a result, sufficient smoothness of the coating can reliably be obtained. Furthermore, the lifespan of the rod can have a sufficient lifespan and the rod can be prevented from being chipped or peeled during the use of the rod.

By setting the film thickness to 4.0 $\mu$m or less, it can be avoided that the coating is easily chipped. Thus, in the case that the temperature of the rod changes at the time of forming the coating or in the case that shearing force or normal stress is applied to the rod surface during the use of the rod, the coating is not easily cracked or peeled.

The coating 14 is preferably formed by ion plating. This makes it possible to set the temperature of the coating at the time the coating is formed sufficiently low and make the adhesive force of the coating 14 onto the base material 12 significantly large.

The coating 14 is preferably a TiN film, a TiCN film, a CrN film, a TiC film, a $Al_2O_3$ film, a $Cr_2O_3$ film, a $SiO_3$ film, a $Ti_2O_3$ film, an AlN film, a ZrN film, a SiC film, a DLC film or the like. However, the type of coating 14 is not limited to these examples.

To adjust the amount of the coating solution, some means may be set on the side of the surface of the coating device rod 10. It is simple and easy, as a manner for providing this means, to wind a wire (not illustrated) on the rod surface. A coating device rod in which a wire is wound on the surface thereof is generally called a wire bar.

However, if the wire bar is used when coating treatment is performed in vacuum, the treatment in vacuum often becomes difficult because of gas present in a gap between the wire and the base material.

As described above, therefore, in the present embodiment, irregularities based on the grooves 18 are formed in the rod surface (the so-called wireless bar) in order to adjust the amount of the coating solution applied onto the body to be coated. In short, coating-solution-amount-adjusting means is integrated with the coating device rod. Accordingly, coating treatment can be satisfactorily performed even in vacuum.

[Second Embodiment]

The following will describe a rod according to a second embodiment. In the second embodiment, to the same constituent elements as in the first embodiment are attached the same reference numbers. Description thereon is omitted.

Figure 3:
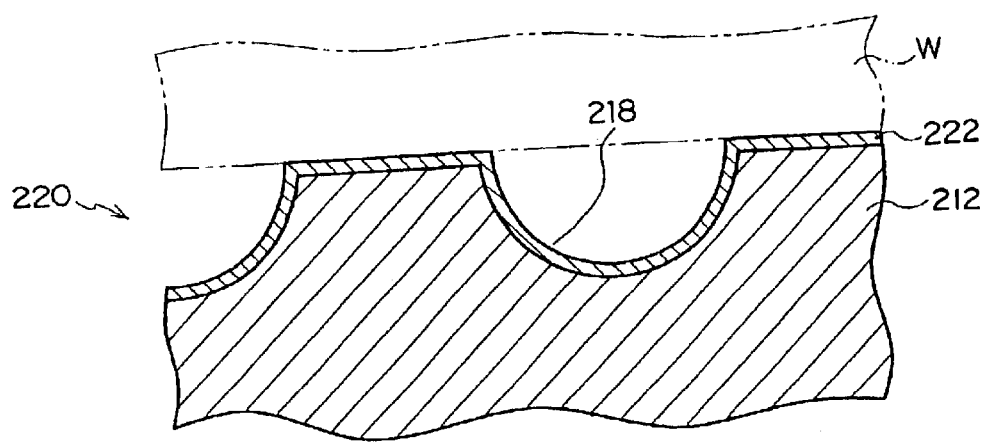
FIG. 3 is a partially-enlarged sectional side view of a rod for a coating device according to a second embodiment of the invention.

A rod 220 (see FIG. 3) according to the second embodiment is a rod in which an abrasion-resistant coating 222 is formed on a base material 212 in an HCD manner (holocathode manner).

The surface state of the coating 222 formed in the HCD manner is superior in smoothness to that of any coating formed in any other manner of ion plating. For this reason, the contact area between the coating and the running web W increases so that a maximum shearing stress generated in the coating in the step of coating decreases. Since this makes the abrasion rate of the coating 222 small, the abrasion resistance of the coating 222 can be made better than in the first embodiment.

As the material of the coating 222, DLC (diamond-like carbon) or TiN (titanium nitride) is preferred. Other preferred examples thereof include TiCN, CrN, TiC, $Al_2O_3$, $Cr_2O_3$, $SiO_3$, $Ti_2O_3$, AlN, ZrN, and SiC. Alternatively, a film made of Ni, Cr, W, Co or the like may be formed by plating.

In the present embodiment, irregularities based on groove 218 may be formed in the rod surface in the same manner as in the first embodiment in order to adjust the amount of a coating solution applied onto a body to be coated.

EXAMPLE 1

Base materials, made of stainless steel (SUS 304) and having a diameter of 13 mm$\phi$, were used as the base materials 12 to produce rods in which materials of their coatings (coating species) were varied as a parameter. The coatings were formed by ion plating.

These rods were used as rods for performing both of the coating of the running web W and the adjusting of the amount of a coating solution. As illustrated in FIG. 1, experiments in which the web W running at a running speed of 50 m/minute was coated with the coating solution were made. The rotation direction Q of each of the rods was set such that the rod surface contacting the web W was shifted to the direction opposite to the web running direction P (see FIG. 1) Regarding physical properties of the coating solution, the viscosity thereof was 8 cp and the surface tension thereof was 22 mN/m. The formulation of the coating solution is shown in Table 1.

TABLE 1

| | |
|---|---|
| Polyurethane resin of 4,4-diphenylmethane diisocyanate/hexamethylenediisocyanate/tetraethylene glycol/ 2,2-bis(hydroxymethyl)propionic acid = 80/20/70/30 (mole ratio) [weight average molecular weight: 100000] | 5.0 g |
| Dodecylbenzene sulfonate of a condensate (diazo resin) of 4-diazodiphenylamine and paraformaldehyde) | 1.2 g |
| Copolymer of styrene/mono-4-methyl-2-pentyl malate = 50/50 (mole ratio) [weight average molecular weight: 100000] | 0.1 g |
| Tricresyl phosphate | 0.3 g |
| 4-Sulfophthalic acid | 0.1 g |
| 85% phosphoric acid | 0.05 g |
| Dye in which the couteranion of Victoria Pure Blue-BOH (manufactured by Hodogaya Chemical Co., Ltd.) was changed into naphthalenesulfonic acid | 0.15 g |
| Megafac F-176 (fluorine-containing surfactant made by Dainippon Ink & Chemicals, Inc.) | 0.3 g |
| γ-Butyrolactone | 10 g |
| 1-Methoxy-2-propanol | 24 g |
| Methyl ethyl ketone | 35 g |
| Methanol | 30 g |
| Water | 1 g |

The materials of the coatings formed on the rod surfaces, and natures of the materials (the friction coefficient between the web W and each of the materials, and hardness) are shown in Table 2. Results of the coating experiments are shown in FIG. 4. In Table 2, a section of "Material" having the description "SUS 304" means that no coating was formed.

TABLE 2

| Material | Friction coefficient (−) | Hardness (Hv) |
|---|---|---|
| DLC | 0.1 | 1800 |
| TiN | 0.4 | 1800 |
| SUS304 | 0.5 | 500 |
| Hard Cr | 0.5 | 1000 |
| Ni + PTFE | 0.1 | 550 |
| Ni + B | 0.5 | 1200 |

As can be understood from Table 2 and FIG. 4, in the case that the coating on the base material 12 was made to be a DLC film or a TiN film, the abrasion resistances thereof were remarkably better than in the case of the coatings made of other materials.

Figure 5:
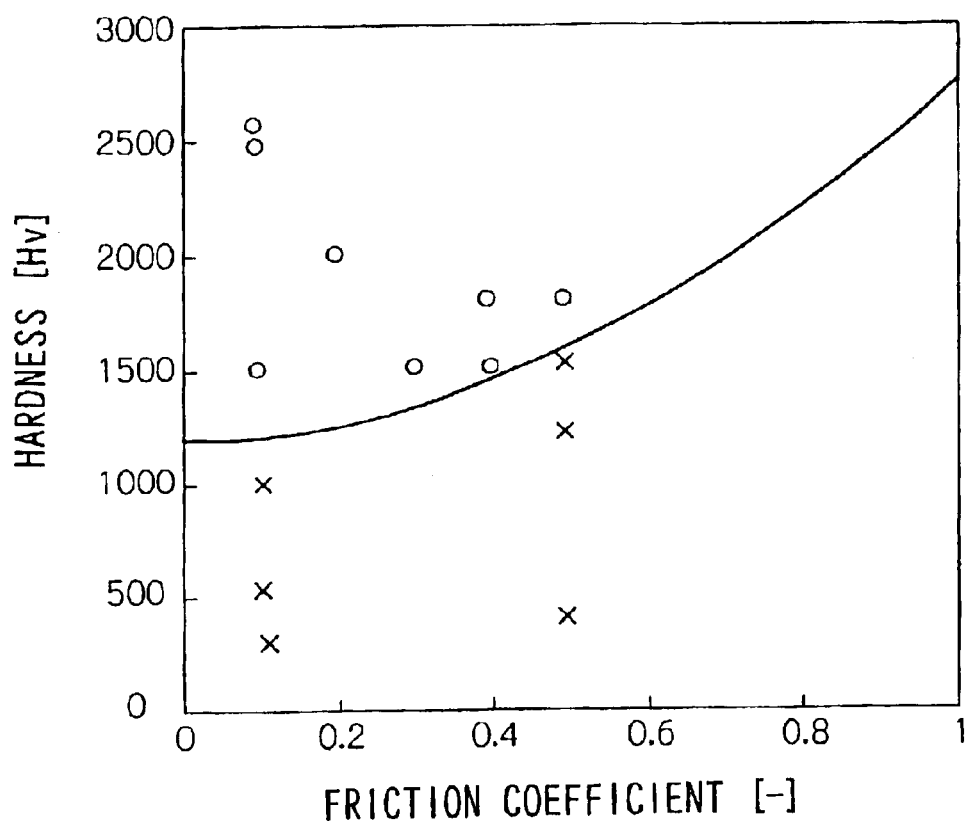
FIG. 5 is a graph showing experimental results in Example 1.

Paying attention to relationship between the hardness of the coatings and the friction coefficient thereof, results of experiments in which a coating length was set to $2 \times 10^5$ m were examined. When the amount of abrasion was 1.0 μm or less, the mark "○" was plotted as a good result in FIG. 5. When the abrasion amount was 1.0 μm or more, the mark "X" was plotted as a bad result in FIG. 5. In FIG. 5, the area above a curve represented by a solid line is an area satisfying the expression (1) described in the first embodiment.

The results demonstrate that in order to evaluate the abrasion resistant of a coating, it is necessary to consider both of the hardness of the coating and the friction coefficient thereof and further that in experiments in which the web W is coated with a coating solution, the coating is not easily abraded in the case that the expression (1) is satisfied and the coating is easily abraded in the case that the expression (1) is not satisfied. The results also demonstrate that it is preferable to set the hardness Hv to 1500 or more and set the friction coefficient $\mu$ to 0.5 or less and it is more preferable to set the hardness Hv to 1800 or more and set the friction coefficient $\mu$ to 0.4 or less.

EXAMPLE 2

Base materials, made of stainless steel (SUS 304) and having a diameter of 13 mmφ, were used as the base materials 12 to produce a rod whose surface was coated with a TiN film in an HCD method and a rod whose surface was coated with a TiN film in an AIP method (arc discharge method). (In either case, the coating was formed by ion plating).

These rods were used as rods for performing both of the coating of the running web W with a coating solution and the adjusting of the amount of the coating solution. As illustrated in FIG. 1, experiments in which the web W running at a running speed of 50 m/minute was coated with the coating solution were made. About physical properties of the coating solution, the viscosity thereof was 7 cp and the surface tension thereof was 25 mN/m. The formulation of the coating solution is shown in Table 3.

TABLE 3

| | |
|---|---|
| Polyurethane resin of 4 4-diphenylmethane diisocyanate/hexamethylenediisocyanate/tetraethylene glycol/ 2,2-bis(hydroxymethyl)propionic acid = 70/30/60/40 (mole ratio) [weight average molecular weight: 80000] | 5.0 g |
| Dibutylnaphthalene sulfonate of a condensate (diazo resin) of 4-diazodiphenylamine and paraformaldehyde) | 1.5 g |
| Copolymer of styrene/mono-4-methyl-2-pentyl malate = 50/50 (mole ratio) [weight average molecular weight: 100000] | 0.1 g |
| Tricresyl phosphate | 0.3 g |
| 4-Sulfophthalic acid | 0.1 g |
| 85% phosphoric acid | 0.05 g |
| Victoria Pure Blue-BOH (manufactured by Hodogaya Chemical Co., Ltd.) | 0.15 g |
| Megafac F-176 (fluorine-containing surfactant made by Dainippon Ink & Chemicals, Inc.) | 0.3 g |
| 1-Methoxy-2-propanol | 25 g |
| Methyl ethyl ketone | 35 g |
| Methanol | 35 g |
| Water | 5 g |

The experimental results of the case in which the surface was hard Cr (H—Cr) and the case in which the surface was SUS 304, and the present experimental results were compared. Materials of the coatings formed on the rod surfaces, and the thicknesses of the coatings are shown in Table 4. Results of coating experiments are shown in FIG. 6.

TABLE 4

| No. | Kind | Film thickness [μm] |
|---|---|---|
| 1 | SUS304 | — |
| 2 | Hard Cr | 12 |
| 3 | TiN (HCD) | 3 |
| 4 | TiN (AIP) | 3 |

Figure 6:
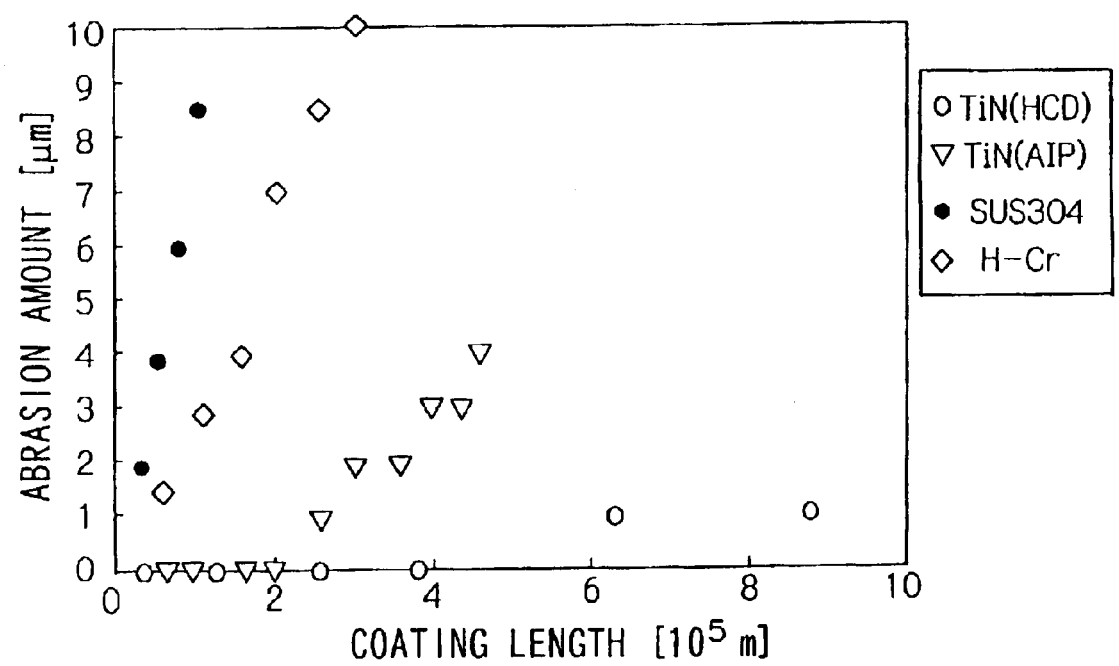
FIG. 6 is a graph showing experimental results in Example 2.

As can be understood from Table 4 and FIG. 6, in the case that the material of the coating was TiN, the abrasion resistance thereof was remarkably better than in the case that the material was hard Cr and was SUS 304. Moreover, it was understood that the abrasion resistance of the TiN film formed in the HCD method was far better than that of the TiN film formed in the AIP method when they had the same film thickness.

Figure 7:
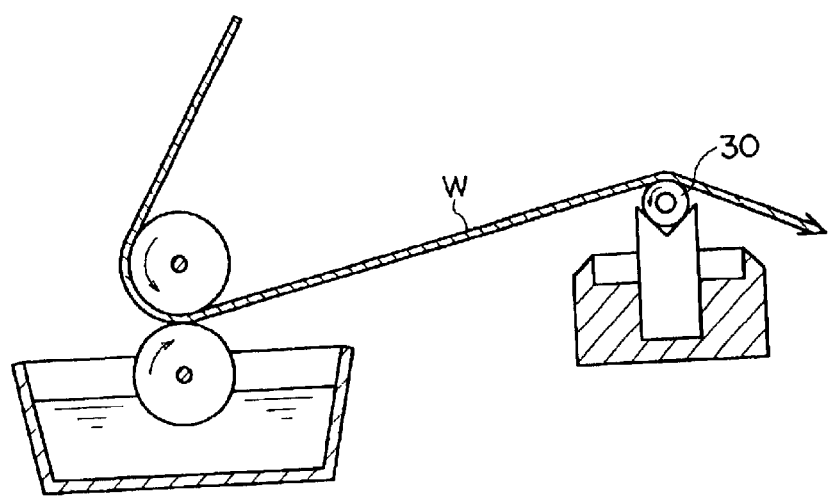
FIG. 7 is a sectional side view illustrating an example in which a rod for a coating device is used as a rod of a type of scratching off an excess of a coating solution applied to a web.
Figure 8:
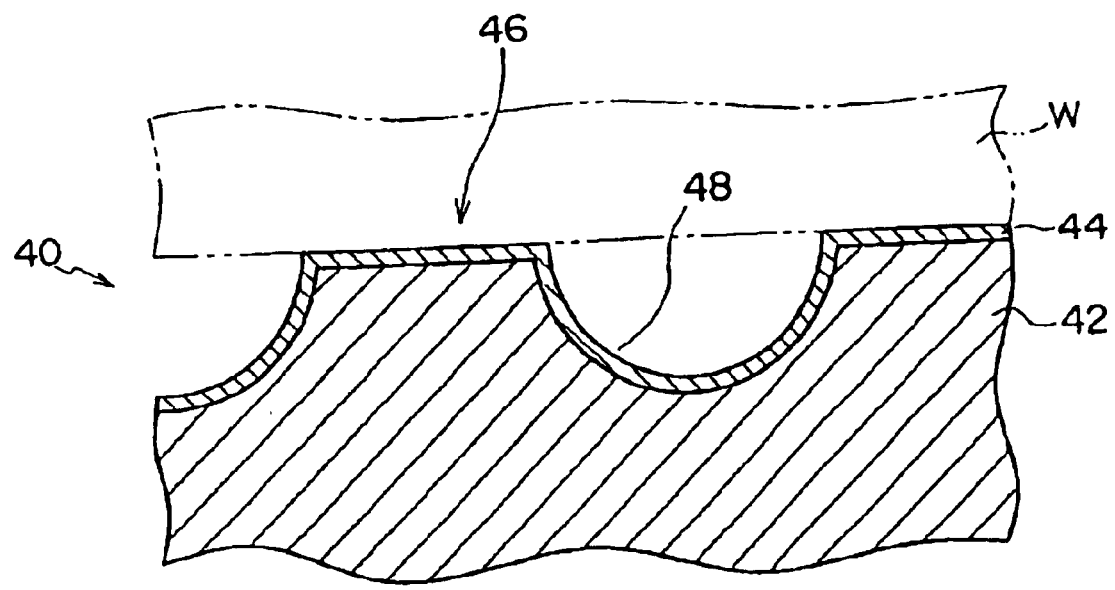
FIG. 8 is a partial sectional side view of a rod for a coating device in the prior art for being compared with first and second embodiments of the invention.

The above has described the first embodiment and second embodiment, and Examples thereof. The above-mentioned embodiments are mere examples and can be varied within the scope which does not depart from the subject matter of the invention. For example, the invention can be used as a rod 30 of a type scratching off an excess of the coating solution applied onto the web W (see FIG. 7). Of course, the scope of the invention is not limited to the above-mentioned embodiments.

The effects resulting from the first and second embodiments of the invention are summarized as the effects of the first aspect described in "Summary of the Invention".

[Third Embodiment]

The following will describe the second aspect of the invention by way of the following third embodiment. For simplicity, in the preset embodiment, a rod for a coating device is referred to as merely "a rod".

Figure 9:
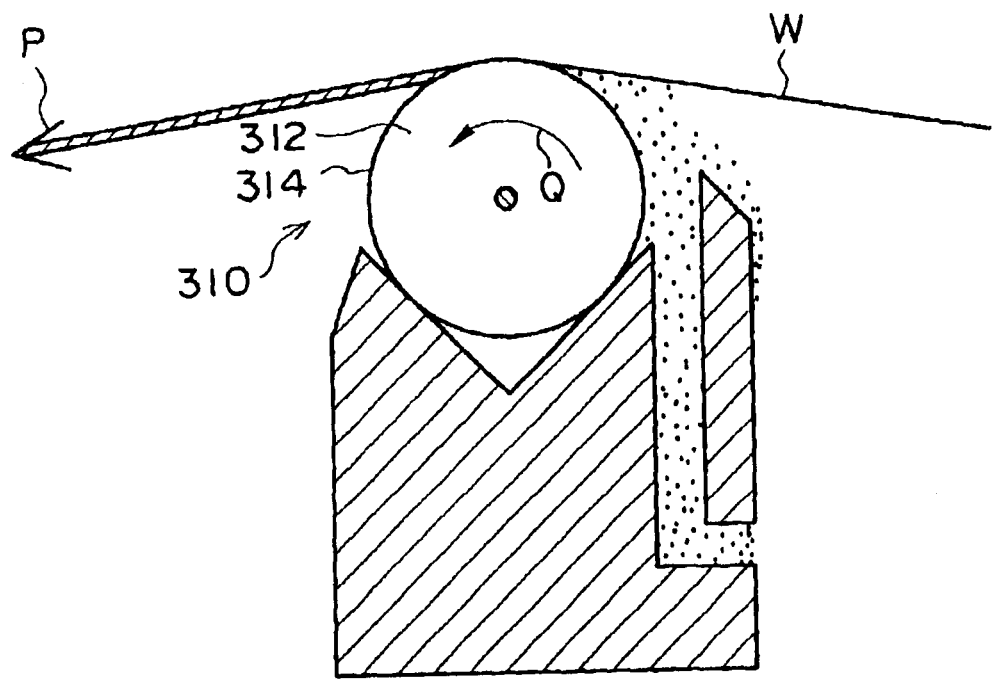
FIG. 9 is a sectional side view illustrating the step of using a rod for a coating device according to a third embodiment of the invention so as to coat a web with a coating solution.

As illustrated in FIG. 9, a rod 310 according to the present embodiment is a rod for performing both of coating a running web W with a coating solution and adjusting of the amount of the coating solution.

Figure 10:
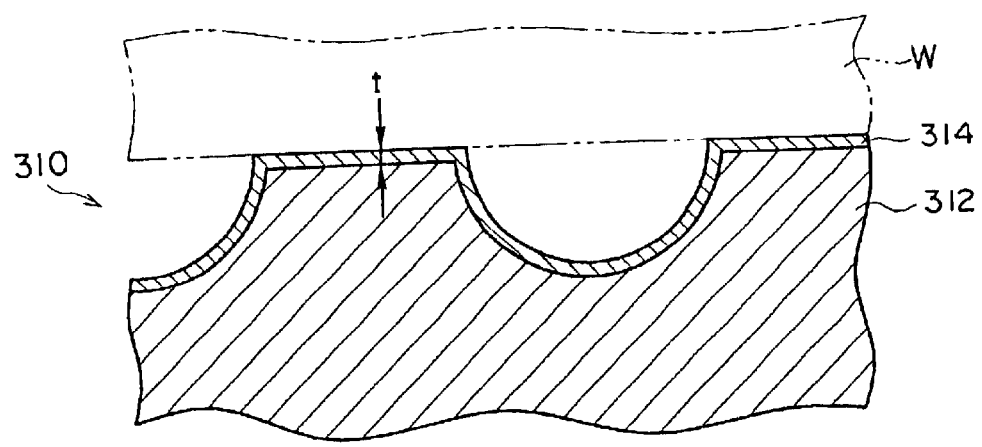
FIG. 10 is a partially-enlarged sectional side view of the coating device rod according to the third embodiment.

As illustrated in FIG. 10, the rod 310 is a rod in which a coating 314 is formed on the circumferential surface of a base material 312. In many cases, the base material 312 is made of stainless steel. The coating 314 is formed by means of an ion plating device.

As the material of the coating 314, DLC (diamond-like carbon) or TiN (titanium nitride) is preferred. Other preferred examples thereof include TiCN, CrN, TiC, $Al_2O_3$, $Cr_2O_3$, $SiO_3$, $Ti_2O_3$, AlN, ZrN, and SiC. Alternatively, a film made of Ni, Cr, W, Co or the like may be formed by plating.

When the thermal expansion coefficient of the base material is represented by $\alpha_1 \times 10^{-6}/°$ C., the thermal expansion coefficient of the coating is represented by $\alpha_2 \times 10^{-6}/°$ C., and the film thickness of the coating is represented by t $\mu$m, the materials of the base material 312 and the coating 314 are selected in such a manner that the following relationship expression is satisfied:

$$|\alpha_1 - \alpha_2| < 3/(t-4) + 7 \quad (2)$$

As a result, thermal stress generated on the coating when the coating is formed, or residual stress generated after the formation of the film can be reduced to a given value or less so that the coating can be prevented from being chipped or peeled while the rod is produced or used.

The coating 314 is formed by means of an ion plating device. In the ion plating device, the coating can be formed at a relatively low temperature. Therefore, a difference in temperature of the rod between when the coating is formed thereon and when the rod is at ambient temperature becomes small, so that thermal stress generated in the coating when the coating is formed or residual stress generated in the coating after the coating is formed can be decreased. For this reason, the coating 314 is not easily cracked or peeled.

In this manner, in the rod 310 according to the present embodiment, the surface thereof is prevented from being chipped. Accordingly, the lifespan of the rod is made longer and the number of the rods to be consumed per production can be reduced. As a result, costs can be significantly reduced and further the frequency of rod-exchanges is decreased. Thus, the operation rate of the line for the production is improved.

EXAMPLE

Base materials, made of stainless steel (SUS 304) and having a diameter of 13 mm$\phi$, were used as the base materials 312 to produce rods in which materials of their coatings (coating species), film thickness and so on were varied as a parameter.

These rods were used as rods for performing both of the coating of the running web W with a coating solution and the adjusting of the amount of the coating solution. As illustrated in FIG. 9, experiments in which the web W running at a running speed of 70 m/minute was coated with the coating solution were made. The rotation direction Q of each of the rods was set such that the rod surface contacting the web W was shifted to the direction equal to the web running direction P (see FIG. 9). The formulation of the coating solution is shown in Table 1.

TABLE 1

| | |
|---|---|
| Esterified product of 1,2-diazonaphthoquinone-5-sulfonyl chloride and pyrrogallol-acetone resin (described in Example 1 of U.S. Pat. No. 3,635,709) | 0.8 g |
| Cresol-formaldehyde novolak resin (ratio of meta to para: 6/4, weight average molecular weight: 7,000, number average molecular weight: 2,500, and residual monomer: 0.7%) | 1.0 g |
| Phenol-p-cresol-formaldehyde novolak resin (ratio of phenol to p-cresol: 55/45, weight average molecular weight: 8,000, number average molecular weight: 1600, and residual monomer: 0.5%) | 0.3 g |
| Phenol-formaldehyde novolak resin (weight average molecular weight: 15,000, number average molecular weight: 2,400, and residual monomer: 1.2%) | 0.2 g |
| Poly[N-(p-aminosulfonylphenyl)acrylamide-co-normalbutyl acrylate-co-diethylene glycol monomethyl ether methacrylate] (mole ratio among them: 40/40/20), weight average molecular weight: 40,000, number average molecular weight: 20,000) | 0.4 g |
| p-Ethylphenol-formaldehyde | 0.2 g |
| Naphthoquinone-1,2-diazide-4-sulfonate chloride | 0.02 g |
| Tetrahydrophthalic anhydride | 0.16 g |
| Benzoic acid | 0.02 g |
| Pyrrogallol | 0.05 g |
| 4-[p-N,N-bis(ethoxycarbonylmethyl)aminophenol]-2,6-bis(trichloromethyl)-S-triazine | 0.07 g |
| Curcumin | 0.007 g |
| Dye in which the couteranion of Victoria Pure Blue-BOH (manufactured by Hodogaya Chemical Co., Ltd.) was replaced with naphthalenesulfonic acid | 0.045 g |
| F176PF (fluorine-containing surfactant (20% MIBK solution) (manufactured by Dainippon Ink & Chemicals, Inc.) | 0.06 g |
| MCF-312 (fluorine-containing surfactant (20% MIBK solution) (manufactured by Dainippon Ink & Chemicals, Inc.) | 0.1 g |
| Methyl ethyl ketone | 15 g |

The coated surface state of the web and the rod surface state of each of the rods after the experiment were examined. The structures of the produced rods, and results of the coating experiments are shown in Table 2.

TABLE 2

| No. | Film species | Film thickness [μm] | Thermal expansion coefficient [10⁻⁵/° C.] | Thermal expansion coefficient difference between the coating and the base material [10⁻⁶/° C.] | Coated surface state | Rod surface |
|---|---|---|---|---|---|---|
| 1 | DLC | 1 | 7.0 | 9.5 | Good | Good |
| 2 | DLC | 2 | 7.0 | 9.5 | Good | Good |
| 3 | DLC | 4 | 7.0 | 9.5 | Good | Good |
| 4 | DLC | 5 | 7.0 | 9.5 | Score mark | Chipped |
| 5 | TiN | 1 | 8.4 | 8.1 | Good | Good |
| 6 | TiN | 2 | 8.4 | 8.1 | Good | Good |
| 7 | TiN | 4 | 8.4 | 8.1 | Good | Good |
| 8 | TiN | 5 | 8.4 | 8.1 | Score mark | Chipped |
| 9 | Ni | 3 | 13.3 | 3.2 | Good | Good |
| 10 | Ni | 6 | 13.3 | 3.2 | Good | Good |
| 11 | Ni | 12 | 13.3 | 3.2 | Good | Good |
| 12 | Cr | 3 | 12.5 | 4.0 | Good | Good |
| 13 | Cr | 12 | 12.5 | 4.0 | Good | Good |

(Thermal expansion coefficient of the base material (SUS304): 16.5 × 10⁻⁶/° C.)

As can be understood from Table 2, in two rods (No. 4 and No. 8) among the 13 rods, a score mark was generated in the coated surface of the web, and the rod surface was chipped. About the other rods, the coated surface state and the rod surface state were good.

Figure 11:
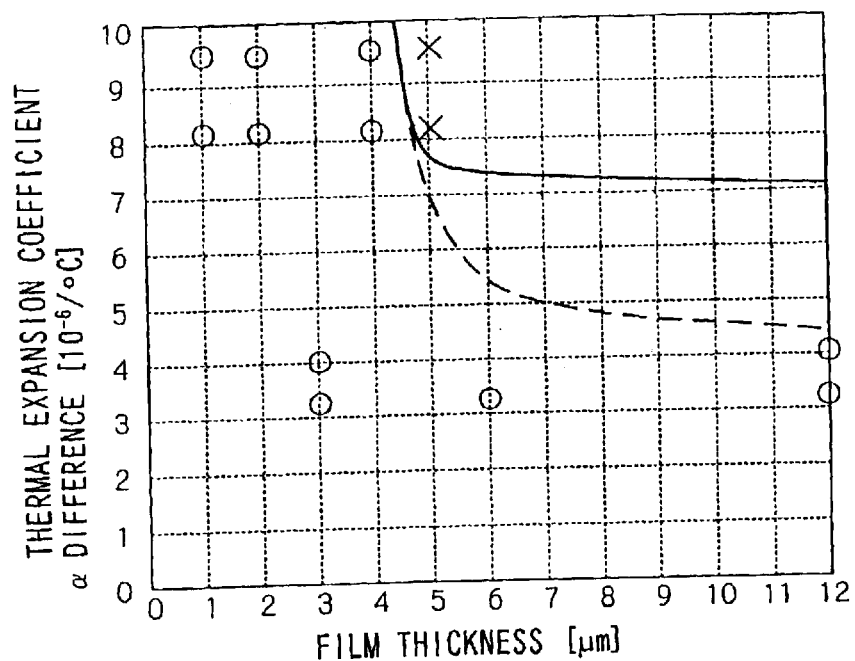
FIG. 11 is a graph showing experimental results in Example of the third embodiment.

In FIG. 11, the results of the above-mentioned experiments are represented as a graph, in which the horizontal axis thereof represents the film thickness of the coating and the vertical axis thereof represents the thermal expansion coefficient difference. In FIG. 11, rods in which inferiority was generated are plotted as X, and good rods are plotted as ○. The area below a solid line curve or at the left side of the curve is an area satisfying the expression (1).

As can be understood from FIG. 11, in the case that the expression (2) was satisfied, good experimental results were obtained. In the case that the expression (2) was not satisfied, inferiority was generated. It was also understood that the area satisfying the relational expression (2) of $|\alpha_1-\alpha_2|<3/(t-4)+7$, that is, the area below a dotted line curve in FIG. 11 or at the left side of the curve is more preferred from the viewpoint of reliability of the product.

Furthermore, it was also understood that, when the thermal expansion coefficient difference between the coating and the base material is large, it is necessary to consider the film thickness in order to prevent the coating from being chipped.

The above has described the second aspect of the invention by the third embodiment and Example thereof. The above-mentioned embodiment is a mere example and can be varied within the scope which does not depart from the subject matter of the invention. For example, the invention can be used as a rod 30 of a type scratching off an excess of the coating solution applied onto the web W (see FIG. 7). Of course, the scope of the invention is not limited to the above-mentioned embodiments.

The effects resulting from the third embodiment of the invention are summarized as the effects of the second aspect described in "Summary of the Invention".

[Fourth Embodiment]

The following will describe the third aspect of the invention by way of the following fourth embodiment. For simplicity, in the preset embodiment, a rod for a coating device is referred to merely as "a rod".

Figure 12:
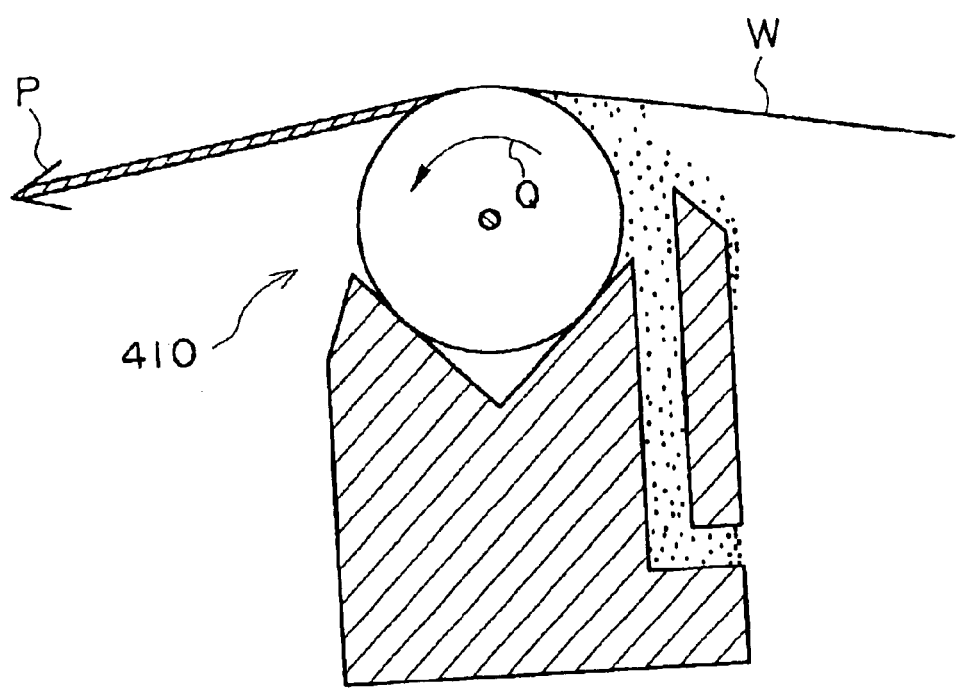
FIG. 12 is a sectional side view illustrating the step of using a rod for a coating device according to a fourth embodiment of the invention so as to coat a web with a coating solution.

As illustrated in FIG. 12, a rod 410 according to the present embodiment is a rod for performing both of coating a running web W with a coating solution and adjusting of the amount of the coating solution.

Figure 13:
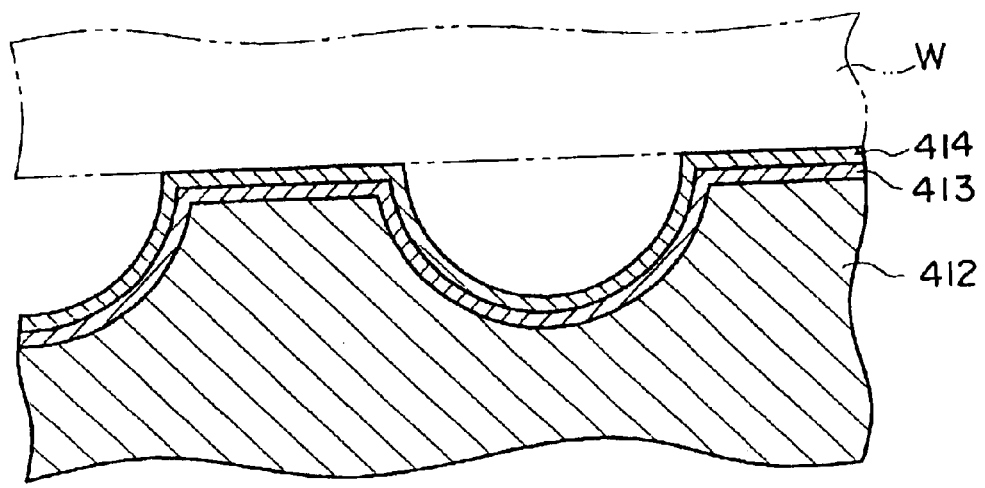
FIG. 13 is a partially-enlarged sectional side view illustrating the structure of the coating device rod according to the fourth embodiment.

As illustrated in FIG. 13, the rod 410 is a rod in which an intermediate layer 413 is formed on a base material 412 and further an abrasion-resistant coating 414 is formed on the intermediate layer 413. In many cases, the base material 412 is made of stainless steel.

In the case that the intermediate layer 413 and the coating 414 are formed by means of an ion plating device, the formation thereof can be attained at a relatively low temperature; therefore, a different in temperature of the rod between when the coating is formed thereon and when the rod is at ambient temperature becomes small, so that the coating 414 or the intermediate layer 413 is not easily cracked or peeled.

When the materials of the intermediate layer 413 and the coating 414 are selected, the thermal expansion coefficients of the base material 412, the intermediate layer 413 and the coating 414 are selected in such a manner that they increase or decrease successively in this order.

In this manner, the intermediate layer 413 acts as a relieving material even if the rod temperature changes so that thermal stress is generated in the coating 414 due to the thermal expansion coefficient difference between the base material 412 and the coating 414. As a result, the thermal stress applied to the respective layers is small. If a highly hard ceramic, which is easily chipped when the film thickness thereof is made large, is formed as the coating 414, the film thickness from the coating 414 to the base material 412 can be made large by the formed intermediate layer 413; therefore, room for the amount of abrasion is generated.

In this manner, in the rod 410 according to the present embodiment, the surface thereof is prevented from being chipped. Accordingly, the lifespan of the rod is made long and the number of the rods to be consumed per production can be reduced. As a result, costs can be significantly reduced and further the frequency of rod-exchanges is decreased. Thus, the operation rate of the line for the production is improved.

EXAMPLE

Base materials, made of stainless steel and having a diameter of 10 mmφ, were used as the base materials 412 to produce 4 kinds of rods (Nos. 1 to 4) in which an intermediate layer and a coating were successively formed on the surface of each of the base material. These rods were used as rods for performing both of the coating of the running web W with a coating solution and the adjusting of the amount of the coating solution. As illustrated in FIG. 12, experiments in which the web W running at a running speed of 60 m/minute was coated with the coating solution were made. The rotation direction Q of each of the rods was set such that the rod surface contacting the web W was shifted to the direction equal to the web running direction P (see FIG. 12). The formulation of the coating solution is shown in Table 1.

TABLE 1

| | |
|---|---|
| Esterified compound of 1,2-naphthoquinonediazide-4-sulfonyl chloride and 2,3,4-trihydroxybenzophenone (esterification degree: 90%) | 0.50 g |
| Cresol-formaldehyde novolak resin (ratio of meta to para: 6/4, weight average molecular weight: 7,000, number average molecular weight: 2,500, and residual monomer: 0.7%) | 0.3 g |
| Poly[N-(p-aminosulfonylphenyl)methacrylamide-co-methyl methacrylate-co-acrylonitrile] (mole ratio among them: 30/40/30), weight average molecular weight: 60,000, number average molecular weight: 20,000) | 1.7 g |
| p-Ethylphenol-formaldehyde | 0.2 g |
| Tetrahydrophthalic anhydride | 0.1 g |
| 4-[p-N,N-bis(ethoxycarbonylmethyl)aminophenol]-2,6-bis(trichloromethyl)-S-triazine | 0.02 g |
| Curcumin | 0.01 g |
| Dye in which the couteranion of Victoria Pure Blue-BOH manufactured by Hodogaya Chemical Co., Ltd.) was replaced with naphthalenesulfonic acid | 0.03 g |
| F176PF (fluorine-containing surfactant (20% MIBK solution) (manufactured by Dainippon Ink & Chemicals, Inc.) | 0.04 g |
| MCF-312 (fluorine-containing surfactant (30% MIBK solution) (manufactured by Dainippon Ink & Chemicals, Inc.) | 0.1 g |
| Methyl ethyl ketone | 15 g |
| γ-Butyrolactone | 10 g |

Structures of the produced rods are shown in Table 2, and results of experiments using the respective rods are shown in Table 3.

intermediate layer and the coating were relatively middle, large and small, respectively, that is, the rod No. 3, score marks were generated in the coated surface of the web, and the rod surface was significantly chipped after the experiment. With regards to the rod in which no intermediate layer was deposited, i.e., the rod No. 4, in the same manner as in the rod No. 3, a score mark was generated in the coated surface of the web and the rod surface was significantly chipped after the experiment.

The above has described the third aspect of the invention by the fourth embodiment and Example thereof. The above-mentioned embodiment is a mere example and can be varied within the scope which does not depart from the subject matter of the invention. For example, the invention can be used as a rod of a type scratching off an excess of the coating solution applied onto the web W (see FIG. 7). Of course, the scope of the invention is not limited to the above-mentioned embodiments.

The effects resulting from the fourth embodiment of the invention are summarized as the effects of the third aspect described in "Summary of the Invention".

[Fifth Embodiment]

The following will describe the fourth aspect of the invention by way of the following fifth embodiment. For simplicity, in the preset embodiment, a rod for a coating device is referred to merely as "a rod".

Figure 14:
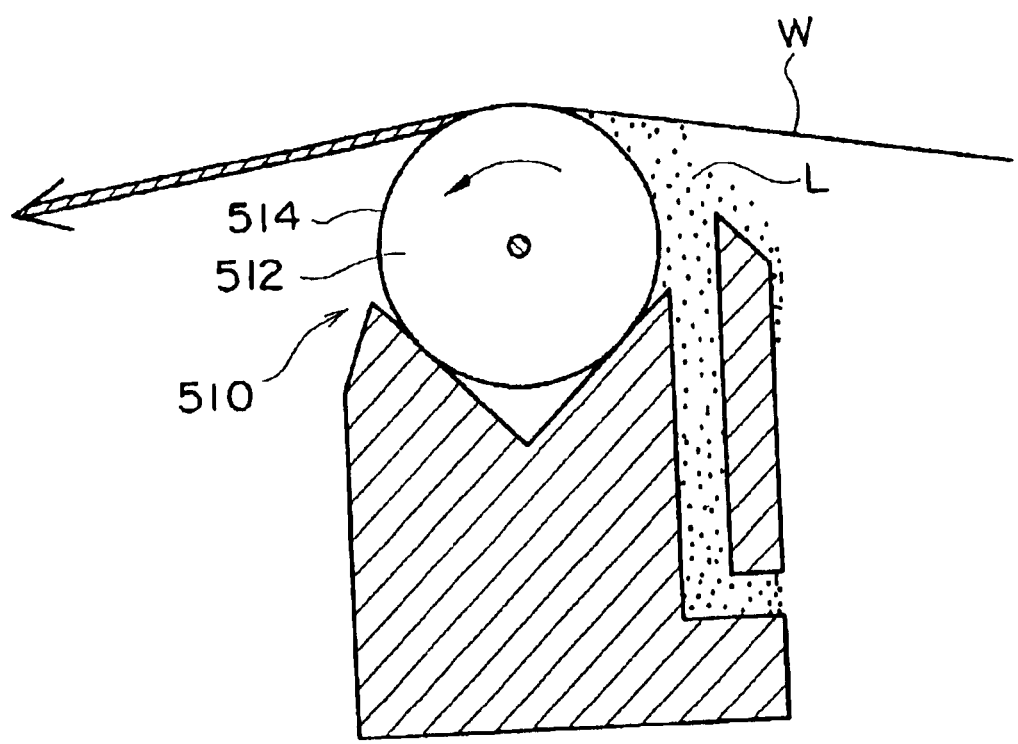
FIG. 14 is a sectional side view illustrating the step of using a rod for a coating device produced in a fifth embodiment of the invention, to apply a coating solution.

As illustrated in FIG. 14, the process for producing a rod according to the present fifth embodiment is a process for producing a rod used for coating a running web W with a coating solution L.

The rod 10 is a rod in which an abrasion-resistant coating 514 is formed on the circumferential surface of a base material 512. In many cases, the base material 512 is made of stainless steel. The coating 514 is formed by means of an ion plating device.

TABLE 2

| | Base material | | | Intermediate layer | | | | Coating | | |
|---|---|---|---|---|---|---|---|---|---|---|
| No. | Material | Thermal expansion coefficient [×10⁻⁶/° C.] | Comparison of the thermal expansion coefficient with the other coefficients | Material | Film thickness [μm] | Thermal expansion coefficient [×10⁻⁶/° C.] | Comparison of the thermal expansion coefficient with the other coefficients | Material | Film thickness [μm] | Thermal expansion coefficient [×10⁻⁶/° C.] | Comparison of the thermal expansion coefficient with the other coefficients |
| 1 | SUS | 16.5 | Large | Ni | 3 | 13.3 | Middle | TiN | 2 | 8.4 | Small |
| 2 | SUS | 16.5 | Large | Cr | 3 | 12.5 | Middle | TiN | 2 | 8.4 | Small |
| 3 | SUS | 16.5 | Large | Al alloy | 3 | 20.0 | Small | TiN | 2 | 8.4 | Middle |
| 4 | SUS | 16.5 | Large | None | | | | TiN | 4 | 8.4 | Small |

The components of the Al alloy was as follows: Fe: 0.5%, Si: 0.8%, Mn: 0.5%, Mg: 1.0%, and Al: the balance.

TABLE 3

| No. | Coated surface state | Surface state of the bar |
|---|---|---|
| 1 | Good | Good |
| 2 | Good | Good |
| 3 | Score mark | Significantly chipped |
| 4 | Score mark | Significantly chipped |

As can be understood from Tables 2 and 3, with regards to the rods in which the thermal expansion coefficients of the base material, the intermediate layer and the coating were successively decreased (monotonously decreased) in this order, that is, the rods No. 1 and No. 2, the coated surface state of the web was good and the rod surface state after the experiment was also good.

On the other hand, with regards to the rod in which the thermal expansion coefficients of the base material, the

[Structure of Ion Plating Device]

Figure 15A:
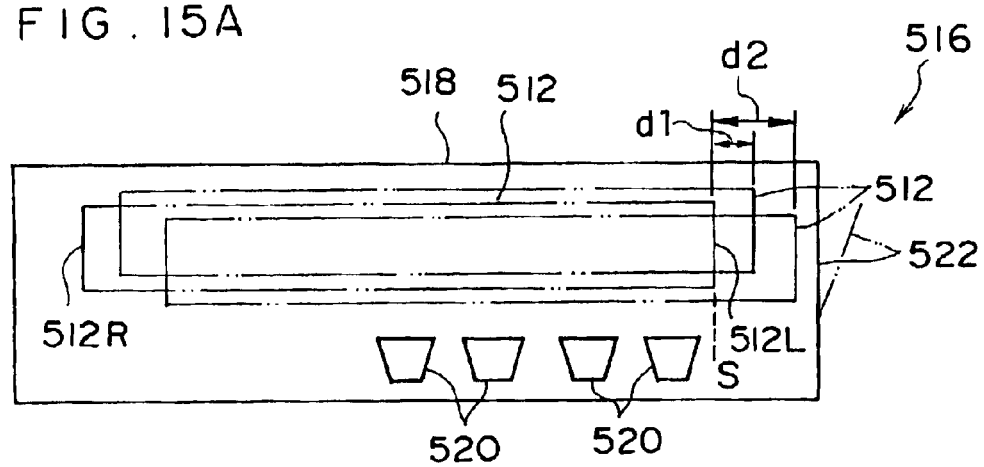
FIGS. 15(A) to 15(C) are sectional side views illustrating: a state that a base material has been arranged in a base material arranging step; a state that a first coating forming step is being performed; and a state that a coating has been formed in the first coating forming step, respectively, according to the fifth embodiment of the invention.
Figure 15B:
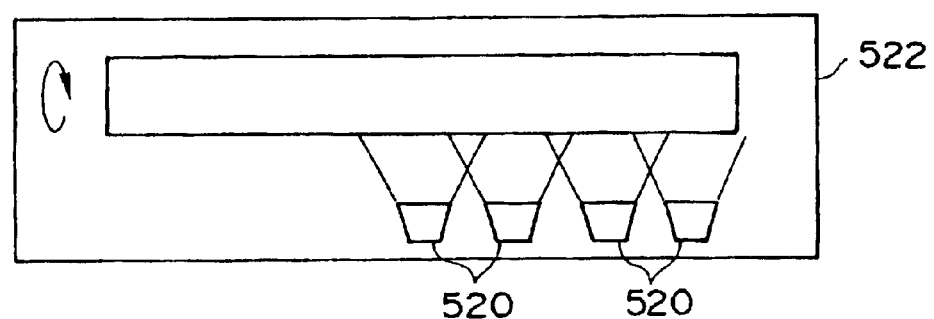
Figure 15C:
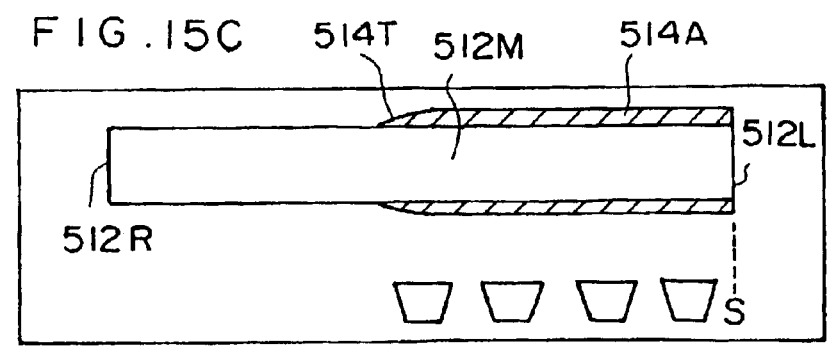

As illustrated in FIGS. 15(A) to 15(C), an ion plating device 516 for forming a coating has a chamber 518 and vapor deposition sources 520 set inside the chamber 520.

The chamber 518 is formed to have a long size making it possible to receive a rod 510, and the vapor deposition sources 520 are arranged over an area from the vicinity of a gate 522 of the chamber 518 to a middle position of the chamber 518 (in the longitudinal direction).

[Production of Product by Forming Film on Base Material]

The ion plating device 516 is used to produce a product (rod) on which an abrasion-resistant coating is formed. First, a columnar base material 512 which has not been used is set at a predetermined setting-position inside the chamber 518. The setting-position at which the base material is to be set is decided according to, for example, a distance between a standard position S inside the chamber 518 and one end 512L of the base material 512 (an arrangement step. See FIG. 15(A)). In the present embodiment, a case in which the position of the one end 512L of the base material 512 coincides with the standard position S is described.

The chamber 518 is subjected to vacuum-suction, and then an abrasion-resistant coating 514A is formed on the base material 512 by ion plating while the base material 512 is rotated around its axis (a first coating forming step. See FIG. 15(B)). At this time, film forming conditions (mainly about film forming time and the output of the ion plating device) for forming the coating 514A is set such that the coating 514A has a desired thickness, and the coating is formed.

As a result, as illustrated in FIG. 15(C), the abrasion-resistant coating 514A is formed over a half area near the vapor deposition sources 520 of the base material 512, which is the area from the one end portion 512L to a central portion 512M. In the central portion 512M, a coating end portion 514T becomes gently thin.

Figure 16A:
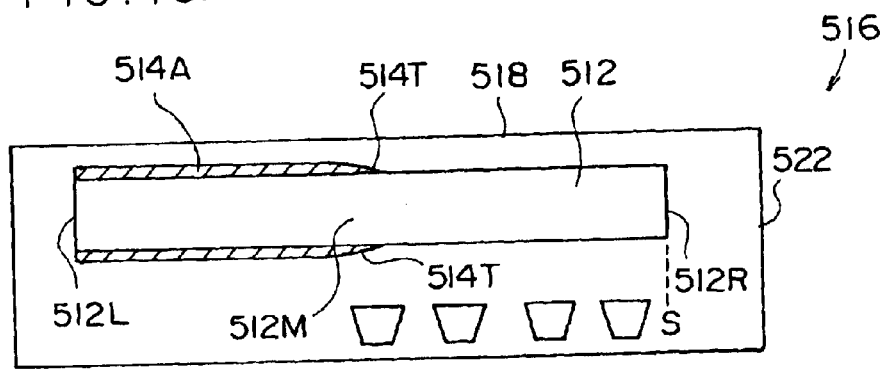
FIGS. 16(A) to 16(C) are sectional side views illustrating: a state that the arrangement-positions of the base material have been exchanged in a rearrangement step; a state that a second coating forming step is being performed; and a state that a coating has been formed in the second coating forming step, respectively, according to the fifth embodiment.

Next, the pressure in the chamber 518 is returned to the atmospheric pressure, and then the base material 512 is pulled out from the chamber 518. The direction of the base material is changed in such a manner that the other end portion 512R which has been located near the inner part of the chamber 518 is arranged at the standard position S. That is, the base material is rearranged in the state that the base material is reversed by 180° and the positions of one end and the other end thereof are exchanged(a rearrangement step, see FIG. 16(A)).

Figure 16B:
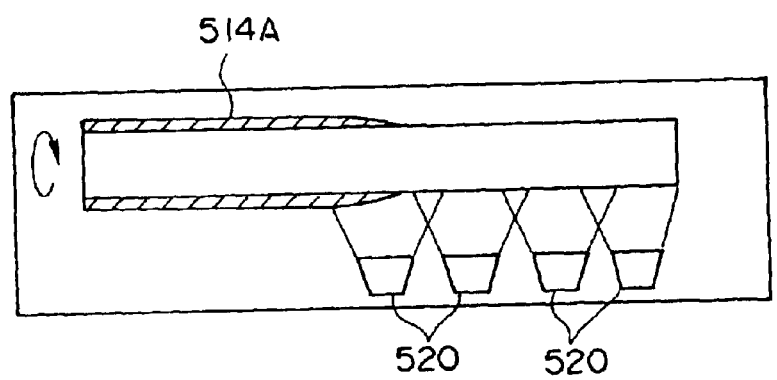

The chamber 518 is subjected to vacuum-suction, and then a coating 514B is formed on the base material under the same conditions as in the case of performing the first coating forming step (a second coating forming step. See FIG. 16(B)).

Figure 16C:
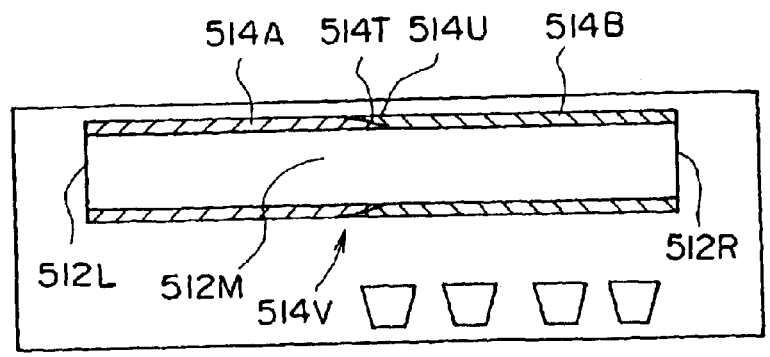

As a result, as illustrated in FIG. 16(C), the abrasion-resistant coating 514B is formed over a half area near the vapor deposition sources 520 of the base material 512, which is the area from the other end portion 512R to the central portion 512M. In the central portion 512M, a coating end portion 514U of the coating 514B becomes gently thin. This coating end portion 514U overlaps with the coating end portion 514T.

As a result, the thickness of a linking portion 514V between the coating 514A and the coating 514B, that is, the thickness of a portion where the coating end portion 514T and the coating end portion 514U overlap with each other is as large as the film thickness at both the ends of the rod. No step is formed at the linking portion 514V.

In this manner, the thickness of the coating 514 can be made to a desired thickness, and further a rod 510 whose abrasion-resistant coating 514 has a uniform thickness is produced. Consequently, when this rod 510 is used to coat the running web W with a coating solution, the contact area between the rod 510 and the web W increases to avoid partial abrasion of the rod 510.

Thus, even if the coating solution is applied at a high speed, it is possible to prevent coating precision from deteriorating or coating defects such as a coating steak from being generated. Even if shearing force or normal stress is applied to the surface of the rod 510 on the basis of force applied from the running web W when the rod 510 is used, the coating 514 is not easily cracked or peeled. Furthermore, the lifespan of the rod 510 is made long and the number of the rods 510 to be consumed per production can be reduced. As a result, costs can be significantly reduced and further the number of rod-exchanges required per production (i.e., the number of rod-exchanges required in a period during which the coating line to which the rod 510 is provided is operated) is reduced. Thus, the operation rate of the line for producing the web W is significantly improved.

As the coating 514, a diamond-like carbon film or a titanium nitride film is preferred. Other preferred examples of the material thereof include TiCN, CrN, TiC, $Al_2O_3$, $Cr_2O_3$, $SiO_3$, $Ti_2O_3$, AlN, ZrN, and SiC.

In the case that the setting-position of the base material 518 inside the chamber 518 is not clear beforehand, it is preferable to perform [Experiment for selecting the setting-position of the base material], which is performed in Example described below. In this experiment, the distance between the setting-position of the one end portion 512L of the base material 512 and the standard position S inside the chamber 518 is changed to d1, d2 or the like in FIG. 15(A) as a parameter and the arrangement position of the base material at which the film thickness of the coating is made even or uniform is determined. In this manner, a preferred setting-position can be found out. When the above-mentioned setting-position is found out for one device of ion plating devices, the same setting-position can be employed in other ion plating devices, as well, as long as the other devices are of the same type as the one device which has been analyzed.

EXAMPLE

Figure 17:
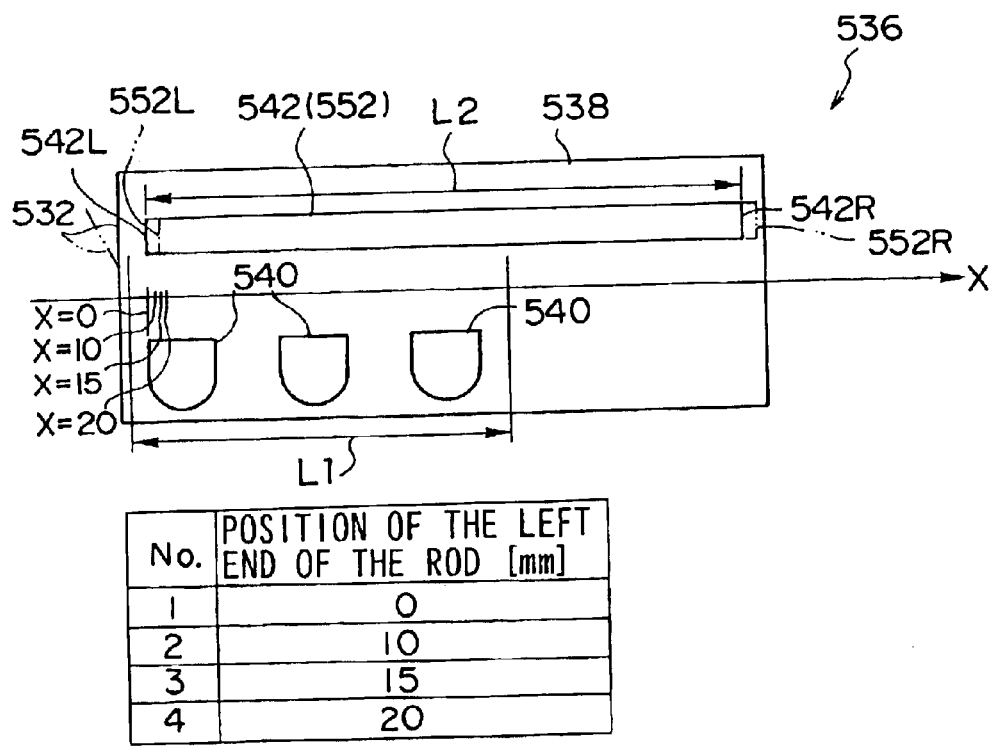
FIG. 17 is a side view illustrating an example in which the arrangement-position (as a parameter) of the base material in a chamber is varied according to Example of the fifth embodiment.

In Example of the present embodiment, an ion plating device was used to produce a rod in which an abrasion-resistant coating was uniformly formed on the surface thereof as follows. As illustrated in FIG. 17, the range in which coating formation is possible, of the ion plating device 536 used in the present example, is a scope where L1 was 900 mm or less in the horizontal direction. The length (L2) of a base material 542 used in the present example was 1600 mm.

[Experiment for Selecting Setting-position of Base Material]

Before producing a product (rod) in which a coating was formed on the base material 542, a setting-position selecting step for obtaining a preferred position of the base material 542 inside a chamber 538 at which position the film thickness of the coating, which is to be applied onto the base material, was made uniform or even (i.e., the so-called condition-selecting experiment) was performed with regards to each of Nos. 1 to 4 shown in FIG. 17.

Figure 18A:
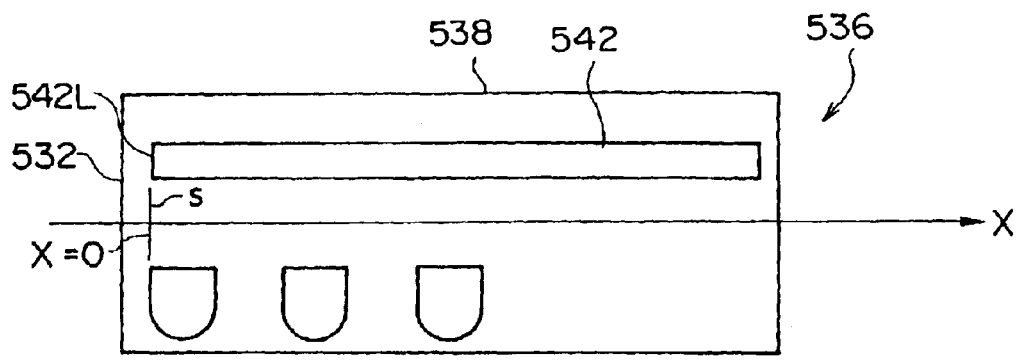
FIGS. 18(A) to 18(C) are sectional side views illustrating: a state that a base material has been arranged in a base material arranging step; a state that a first coating forming step is being performed; and a state that a coating is formed in the first coating forming step, respectively, according to [Experiment for selecting setting-position of base material] of Example of the fifth embodiment.

As illustrated in FIG. 18 (A), one end portion 542L of the base material 542 was arranged to coincide with the standard position S inside the chamber 538. That is, the one end portion 542L was arranged such that the end portion 542L was distanced from the standard position S inside the chamber 538, by 0 mm, toward at the inner side or the chamber (i.e., X=0 mm) (an arrangement step). The one end portion which was near to a gate 532 of the chamber 538 was regarded as the reference end portion 542L. The base material 542 was made of stainless steel and had a diameter of 10 mmφ.

Figure 18B:
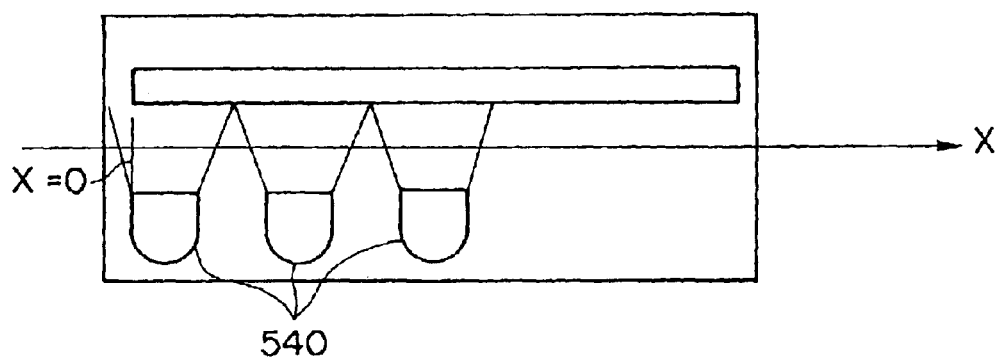
Figure 18C:
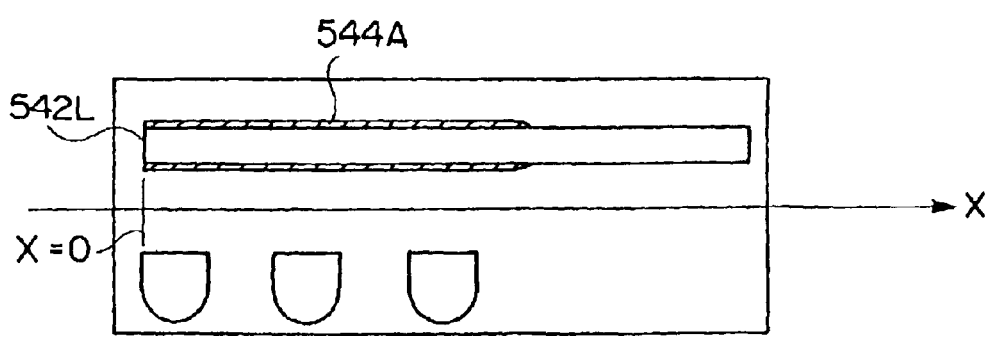

The chamber 538 was subjected to vacuum-suction, and then a coating 544A was formed on the base material 542 by ion plating while the base material 542 was rotated around its axis (a first coating forming step for determining the condition, see FIGS. 18(B) and 18(C)). The component of the coating 544A was made to TiN (the component of a coating 544E, which will be described later, is also TiN) The time for forming the coating was set short.

Figure 19A:
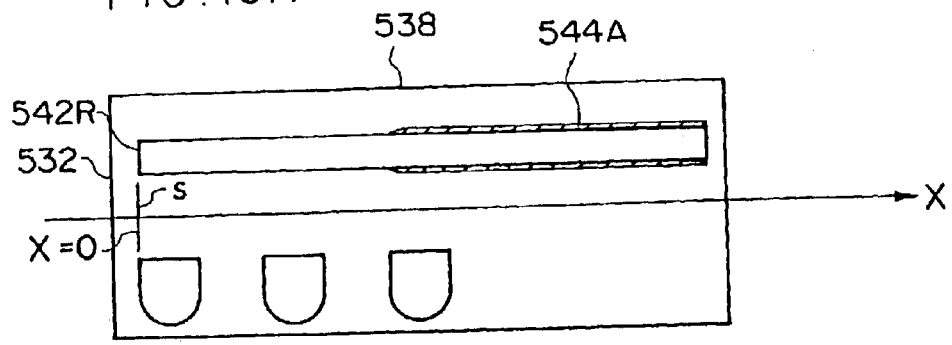
FIGS. 19(A) to 19(C) are sectional side views illustrating: a state that the arrangement-positions of the base material have been exchanged in a rearrangement step; a state that a second coating forming step is being performed; and a state that a coating has been formed in the second coating forming step, respectively, according to [Experiment for selecting setting-position of base material] of Example of the fifth embodiment.

Next, the pressure in the chamber 538 was returned to the atmospheric pressure, and the base material 542 was pulled out from chamber 538. The direction of the base material 542 was changed in such a manner that the other end portion 542R of the base material 542 was arranged at the standard position S. In this way, the base material 542 was rearranged inside the chamber 538 (a rearranging step for determining the condition, see FIG. 19(A)).

Figure 19B:
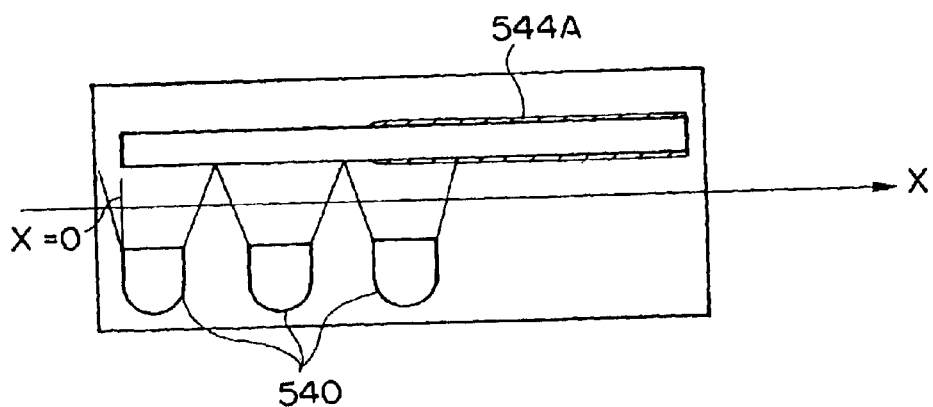
Figure 19C:
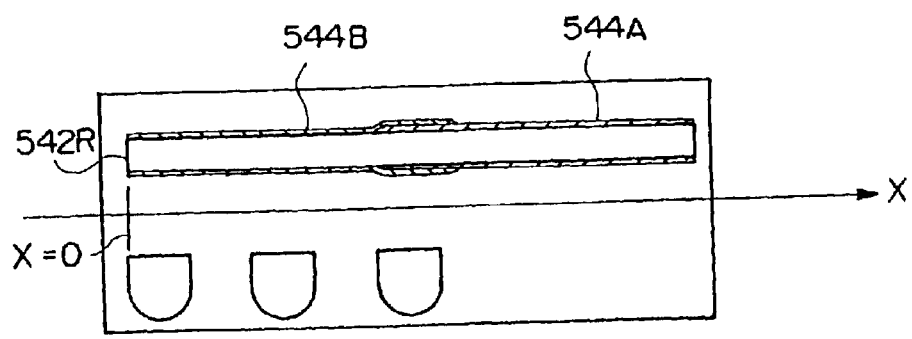

The chamber 538 was subjected to vacuum suction, and then a coating 544B was formed on the base material under the same conditions as in the first coating forming step for determining the condition (a second coating forming step for determining the condition, see FIGS. 19(B) and 19(C)).

Figure 20:
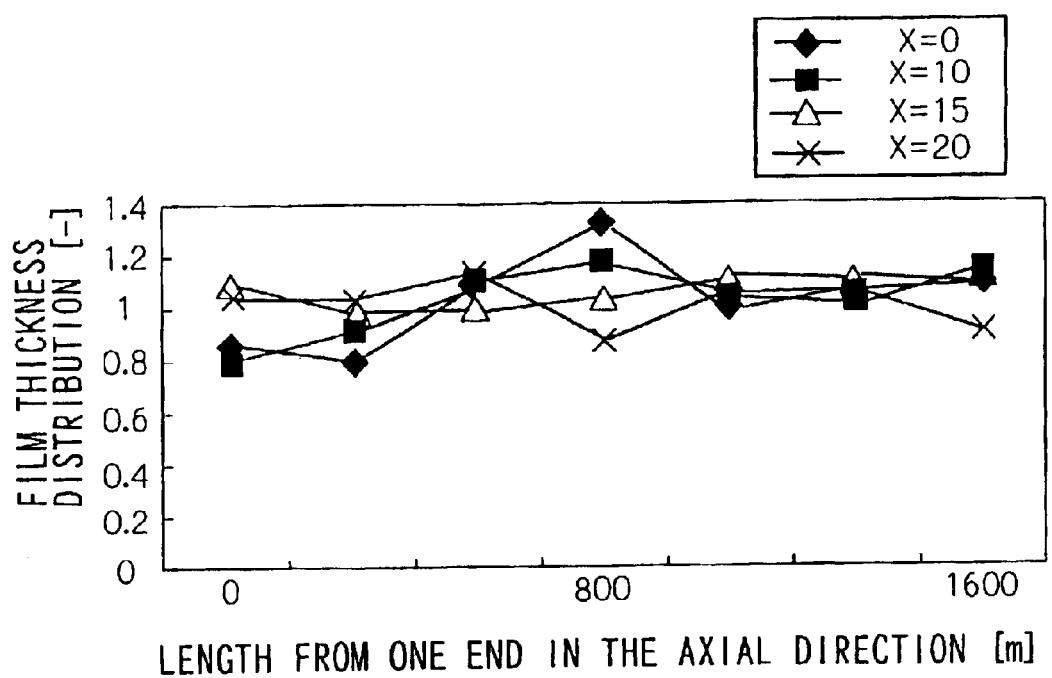
FIG. 20 is a graph showing the film thickness distribution of a coating obtained when [Experiment for selecting setting-position of base material] are performed in Example of the fifth embodiment.

After the second coating forming step for determining the condition, the base material 542 was taken out from the chamber 538 and then the film thickness distribution thereof was examined (see FIG. 20). Film thickness distribution which is represented by the vertical axis of FIG. 20 is a value obtained by dividing the "film thickness of the coating" by "intended film thickness".

A base material 552 which had not been used (see FIG. 17) was used, and one end portion 552L of the base material 552 was set so as to coincide with a position distanced from the standard position S inside the chamber 538, by 10 mm, toward the inner part of the chamber (i.e., a position where X was 10 mm). A coating was then formed under the same conditions as in the first coating forming step for determining the condition. The size of the base material 552, the material thereof, and so on were made the same as those of the base material 542

Next, in the same way as in the rearranging step for determining the condition, the direction of the base material 552 was changed. At this time, the other end portion 552R of the base material 552 was matched with a position where X was 10 mm.

Furthermore, in the same way as in the second coating forming step for determining the condition, a coating was formed. The film thickness distribution of the coating was then examined (see FIG. 20).

In the same way, a coating was formed and the film thickness distribution thereof was examined in cases of X=15 mm and X=20 mm (see FIG. 20).

As is evident from FIG. 20, the results of the above-mentioned experiments demonstrate that the case of X=15 mm was most preferable, that is, the film thickness is most uniform or even.

[Production of Product by Forming Coating on Base Material]

Figure 22A:
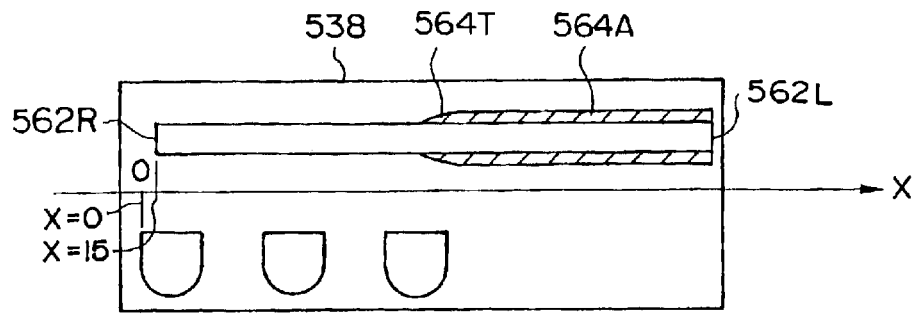
FIGS. 22(A) to 22(C) are sectional side views illustrating: a state that the arrangement-positions of the base material have been exchanged in a rearrangement step; a state that a second coating forming step is being performed; and a state that a coating has been formed in the second coating forming step, respectively, according to Example of the fifth embodiment.
Figure 22B:
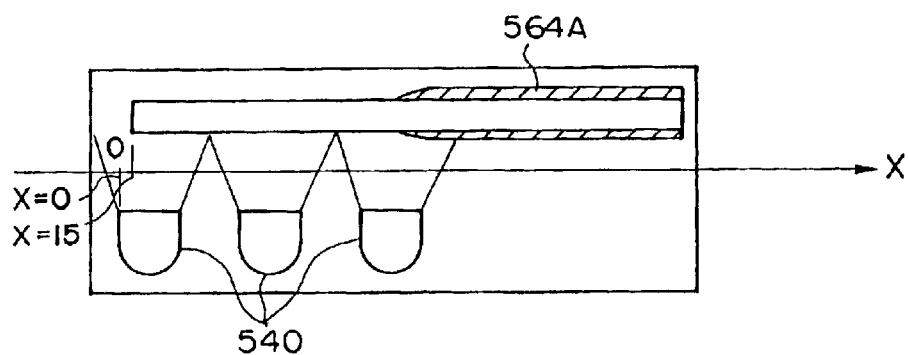
Figure 22C:
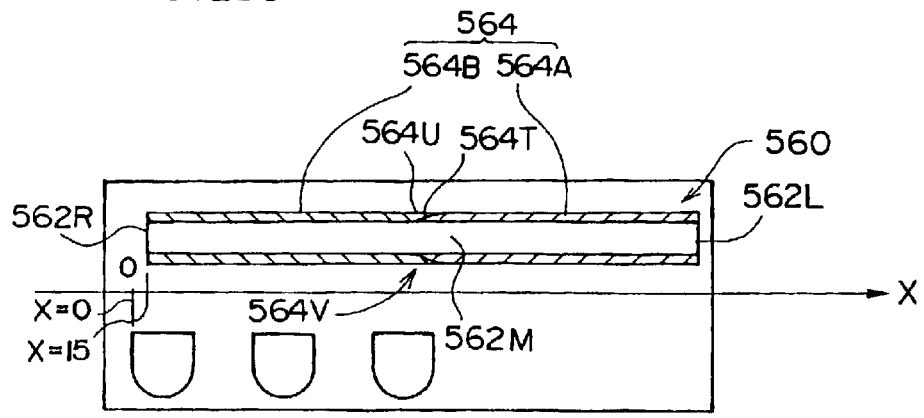

Next, a rod 560 on which an abrasion-resistant coating 564 was formed (see FIG. 22(C)). That is, a product was produced.

Figure 21A:
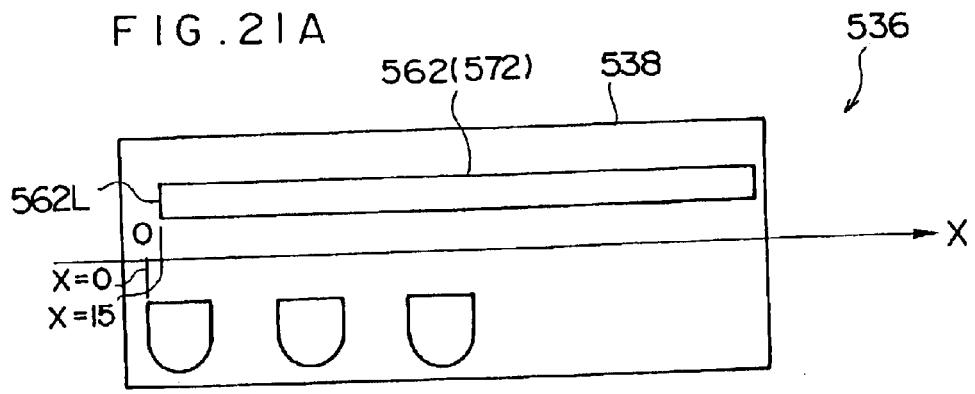
FIGS. 21(A) to 21(C) are sectional side views illustrating: a state that a base material has been arranged in a base material-arranging step; a state that a first coating forming step is being performed; and a state that a coating has been formed in the first coating forming step, respectively, when a product (rod) is produced in Example of the fifth embodiment.

As illustrated in FIG. 21(A), a base material 562 which had not been used was first used to arrange the base material 562 inside the chamber 538 such that the left end position of the base material 562 satisfied X=15 mm (an arrangement step). The size of the base material 562, the material thereof, and so on were made the same as those of the base material 542.

Figure 21B:
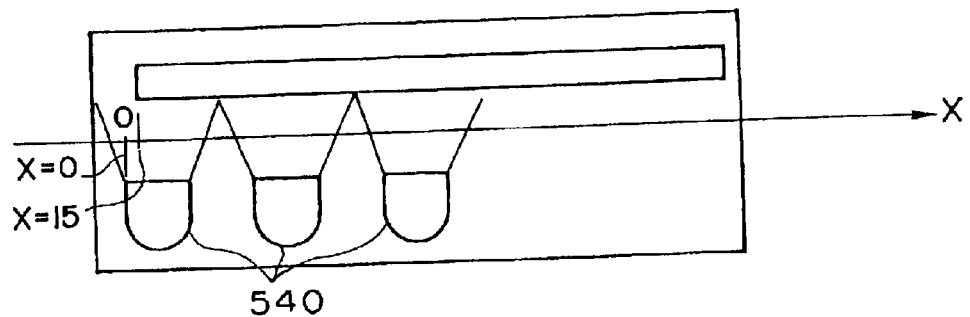
Figure 21C:
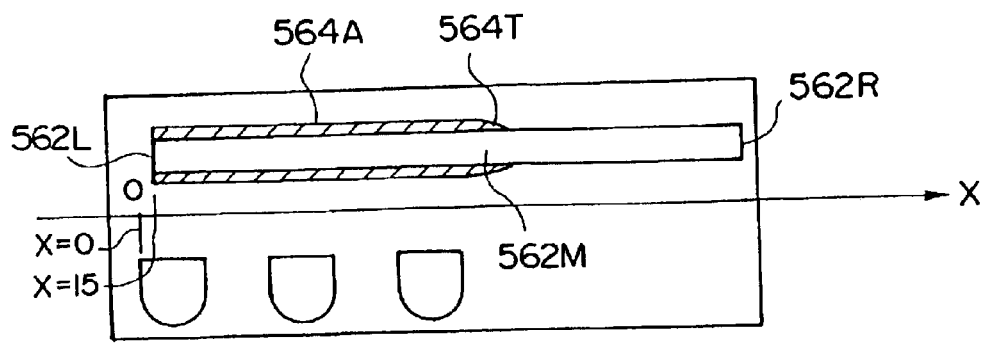

The chamber 538 was subjected to vacuum-suction, and then an abrasion-resistant coating 564A was formed on the base material 562 by ion plating while the base material 562 was rotated around its axis (a first coating forming step. See FIGS. 21(B) and 21(C)).

As a result, the abrasion-resistant coating 564A was formed over a half area near the vapor deposition sources 540, of the base material 562, which was the area from the one end portion 562L to a central portion 562M. In the central portion 562M, a coating end portion 564T becomes gently thin.

At the time of forming the coating, in order to set the film thickness of the coating (TiN film) to 2 $\mu$m, the time for the formation of the coating, the output of the device, and so on were appropriately set on the basis of the thickness of the coating formed in the above-mentioned [experiment for selecting setting-position of base material], the coating-forming time therein, and so on.

Next, the pressure in the chamber 538 was returned to the atmospheric pressure, and then the base material 562 was pulled out from the chamber 538. The direction of the base material 562 was changed and then the base material 562 was rearranged in the chamber 538 in such a manner that the position of the other end portion 562R of the base material 562 satisfied X=15 mm (a rearrangement step. See FIG. 22(A)).

The chamber 538 was subjected to vacuum-suction, and then a coating 564B was formed under the same conditions as in the first coating forming step(a second coating forming step. See FIGS. 22(B) and 22(C)).

As a result, the abrasion-resistant coating 564B was formed over a half area near the vapor deposition sources 540, of the base material 562, which was the area from the other end portion 562R to the central portion 562M. In the central portion 562M, a coating end portion 564U of the coating 564B became gently thin and overlapped with the coating end portion 564T.

Figure 23:
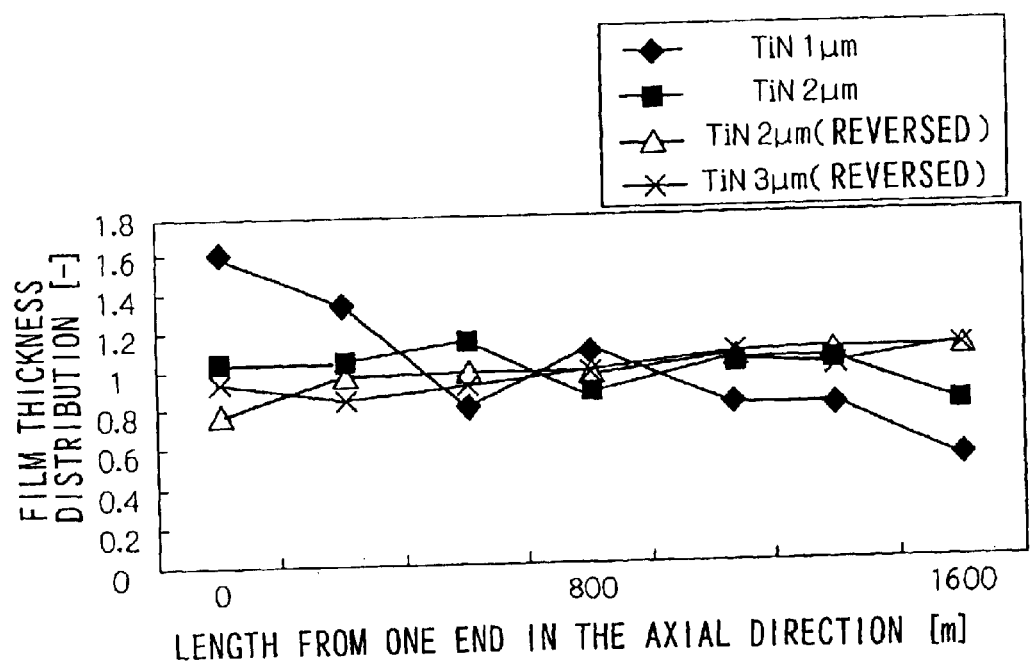
FIG. 23 is a graph showing the film thickness distribution of the coating of the rod for a coating device, obtained in Example of the fifth embodiment.

The film thickness distribution of the coating 564 of this rod 560 was examined. As a result, the value of (the film thickness of the coating)/(intended film thickness, that is, 2 $\mu$m) was suppressed within the range of 0.8 to 1.1, as shown by white triangle marks in FIG. 23.

With intent to form a coating having a thickness of 3 $\mu$m, a base material 572 which had not been used (the size thereof, the material thereof, and so on were the same as those of the base material 562) was used to perform an arrangement step, a first coating forming step, a rearrangement step, and a second coating forming step successively in the same way as in the production of the rod 560. As a result, a linking portion between the coating formed in the first coating forming step and the coating formed in the second coating forming step was smooth.

The film thickness distribution of the coating was examined. As a result, the value of (the film thickness of the coating)/(intended film thickness, that is, 2 $\mu$m) was suppressed within the range of 0.85 to 1.1, as shown by X marks in FIG. 23.

Consequently, it was understood that in the case that the surface of the base material 562(72) having a total length of 1600 mm is coated with a coating (TiN film) having a thickness of 2 or 3 $\mu$m by means of an ion plating device, the value of (the film thickness of the coating)/(intended film thickness) is suppressed within the range of 0.8 to 1.2 and a good film thickness distribution can be obtained if the rearrangement step of reversing the base material is performed.

[Production of Product for Comparison]

In the present example, a rod was produced by forming a coating without performing the rearrangement step.

A base material which had not been used was first used to arrange the base material inside the chamber 538 such that the position of one end position of the base material satisfied X=15 mm. The chamber was subjected to vacuum-suction, and then an abrasion-resistant coating was formed on the base material by ion plating (a first coating forming step).

At the time of forming the coating, with intent to make the film thickness of the coating (TiN film) to 2 $\mu$m even if the above-mentioned rearrangement step was not performed, the time for the formation of the coating, the output of the device, and so on were appropriately set on the basis of the thickness of the coating formed in the above-mentioned

[Experiment for selecting setting-position of base material], the coating-forming time therein, and so on.

The film thickness distribution of the rod in which the coating was formed on the surface of the base material was examined. As a result, the value of (the film thickness of the coating)/(intended film thickness, that is, 2 μm) was suppressed within the range of 0.85 to 1.15, as shown by black square marks in FIG. 23.

Furthermore, a base material which had not been used was used to form a coating in the same way with intent to make the thickness of the coating to 1 μm.

The film thickness distribution of the rod was examined. As a result, the value of (the film thickness of the coating)/ (intended film thickness, that is, 1 μm) was within the range of 0.6 to 1.6, as shown by black diamond shape marks in FIG. 23. That is, the film thickness was more uneven than in the case of performing the rearrangement step.

Consequently, it was understood that in the case that the surface of a base material having a total length of 1600 mm is coated with a coating (TiN film) by means of the ion plating device 36 with intent to make the film thickness of the coating to 1 μm or less, the film thickness becomes more uneven if the rearrangement step of reversing the base material is not performed.

With regards to the above-mentioned four rods, the fractional coefficients and the coating hardnesses thereof were measured. Each of the four rods was used to coat a web running at a running speed of 60 m/minute with a coating solution. The coated surface state was examined. The results are shown in Table 1.

TABLE 1

| No. | Film material | Film thickness [μm] | Friction coefficient [-] | Hardness [Hv] | Reversing treatment | Coating surface state |
|---|---|---|---|---|---|---|
| 1 | TiN | 2 | 0.4 | 1800 | Performed | ○ |
| 2 | TiN | 3 | 0.4 | 1800 | Performed | ○ |
| 3 | TiN | 1 | 0.4 | 1800 | Not performed | ○ |
| 4 | TiN | 2 | 0.4 | 1800 | Not performed | ○ |

As can be understood from Table 1, all of the friction coefficients were the same, all of the hardnesses of the coatings were the same, and further all of the coated surface states were good. Consequently, it was made evident that, when a rod whose coating is formed through two-stage processes separated by a rearranging step is used in practice, no bad effect is produced on the coat surface of a web and the linking portion of the coating is smooth.

The above has described the fourth aspect of the invention by the fifth embodiment and Example thereof. The above-mentioned fifth embodiment is a mere example and can be varied within the scope which does not depart from the subject matter of the invention. For example, the invention can be used as a process for producing a rod of a type scratching off an excess of the coating solution applied onto the web W. Of course, the scope of the invention is not limited to the above-mentioned embodiments.

The effects resulting from the fifth embodiment of the invention are summarized as the effects of the fourth aspect described in "Summary of the Invention".

What is claimed is:

1. A rod for a coating device, used when a continuously-running body to be coated is coated with a coating solution, the rod comprising:

a columnar base material; and an abrasion-resistant coating formed on a circumferential surface of base the material, the coating including at least one layer, wherein when a friction coefficient between a topmost layer of the coating and the body to be coated is represented by $\mu$, a Vickers hardness of the coating is represented by Hv, a thermal expansion coefficient of the base material is represented by $\alpha_1 \times 10^{-6}/°$ C., a thermal expansion coefficient of the coating is represented by $\alpha_2 \times 10^{-6}/°$ C., a film thickness of the coating is represented by t μm, $\mu$ and Hv satisfy a predetermined relational expression, and/or $\alpha_1$, $\alpha_2$ and t satisfy another predetermined relational expression, wherein $\mu$ and Hv satisfy a relationship expression of $Hv > 1500 \times \mu^2 + 1200$; and wherein $\alpha_1$, $\alpha_2$ and t satisfy a relational expression of $|\alpha_1 - \alpha_2| < 3/(t-4) + 7$ if t is larger than 4.

2. A rod for a coating device according to claim 1, wherein Hv is set to 1500 or more.

3. A rod for a coating device according to claim 1, wherein the coefficient $\mu$ is set to 0.5 or less.

4. A rod for a coating device according to claim 1, wherein the coating is formed by ion plating.

5. A rod for a coating device according to claim 4, wherein the coating is formed by ion plating in a holocathode method.

6. A rod for a coating device according to claim 4, wherein the coating is formed at a temperature of 400° C. or less.

7. A rod for a coating device according to claim 1, wherein the film thickness of the coating is set within a range of 0.2 to 4.0 μm.

8. A rod for a coating device according to claim 1, wherein irregularities due to a groove are formed in the circumferential surface of the rod to adjust an amount of the coating solution applied onto the body to be coated.

9. A rod for a coating device according to claim 1, wherein the coating is formed at a temperature of 350° C. or less.

10. A rod for a coating device according to claim 1, wherein $|\alpha_1 - \alpha_2|$ is set to $1 \times 10^{-5}/°$ C. or less.

11. A rod for a coating device according to claim 1, wherein the film thickness t of the coating is set within a range of 0.2 to 0.4 μm.

12. A rod for a coating device according to claim 1, wherein the coating comprises plural layers, and thermal expansion coefficients of the respective layers constituting the coating increase successively or decrease successively from the base material to the topmost layer.

13. A rod for a coating device according to claim 1, wherein at least one intermediate layer is formed between the base material and the abrasion-resistant coating, and the film thickness of the intermediate layer is within a range of 3 to 12 μm.

14. A rod for a coating device according to claim 1, wherein the film thickness of the coating is within a range of 0.2 to 4.0 μm.

15. A rod for a coating device according to claim 1, wherein the coating is formed by ion plating.

16. A rod for a coating device according to claim 15, wherein the coating is formed at a temperature of 350° C. or less.

17. A rod for a coating device according to claim 1, wherein irregularities due to a groove are formed in the circumferential surface of the rod to adjust an amount of the coating solution applied onto the body to be coated.

18. A rod for a coating device, used when a continuously-running body to be coated is coated with a coating solution, which comprising:

a columnar base material; and an abrasion-resistant coating formed on a circumferential surface of the base material, wherein the coating comprises a material selected so that a friction coefficient $\mu$ between the coating and the body to be coated and a Vickers hardness Hv of the coating satisfy a relationship expression of $Hv>1500\times\mu^2+1200$.

19. A rod for a coating device, the rod comprising:

a columnar base material; and an abrasion-resistant coating formed on a circumferential surface of the base material, wherein when a thermal expansion coefficient of the base material is represented by $\alpha_1\times10^{-6}/°C.$, a thermal expansion coefficient of the coating is represented by $\alpha_2\times10^{-6}/°C.$, and a film thickness of the coating is represented by t $\mu$m, a relational expression of $|\alpha_1-\alpha_2|<3/(t-4)+7$ is satisfied.

* * * * *